United States Patent
Sasaki

(10) Patent No.: US 7,961,505 B2
(45) Date of Patent: Jun. 14, 2011

(54) ELECTRONIC DEVICE, METHOD OF MANUFACTURING THE SAME, AND STORAGE DEVICE

(75) Inventor: Masayoshi Sasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 214 days.

(21) Appl. No.: 12/348,509

(22) Filed: Jan. 5, 2009

(65) Prior Publication Data

US 2009/0190392 A1    Jul. 30, 2009

(30) Foreign Application Priority Data

Jan. 24, 2008   (JP) ................................. 2008-013886
Apr. 28, 2008   (JP) ................................. 2008-117459

(51) Int. Cl.
*G11C 11/00* (2006.01)
(52) U.S. Cl. .................. 365/159; 365/129; 365/189.011
(58) Field of Classification Search .................. 365/159, 365/129, 189.011; 257/382, E47.001
See application file for complete search history.

(56) References Cited

U.S. PATENT DOCUMENTS

2006/0237799 A1* 10/2006 Lu et al. .......... 257/382
2007/0121364 A1*  5/2007 Bertin et al. .......... 365/129

FOREIGN PATENT DOCUMENTS

| | | |
|---|---|---|
| JP | 03-076262 | 4/1991 |
| JP | 2005-079335 | 3/2005 |
| JP | 2006-234799 | 9/2006 |
| JP | 2006-245023 | 9/2006 |
| JP | 2007-123828 | 5/2007 |
| JP | 2008-235816 | 10/2008 |
| JP | 2008-311449 | 12/2008 |
| JP | 2009-049287 | 3/2009 |
| WO | 03/028124 | 4/2003 |

OTHER PUBLICATIONS

P. Collier, et al., "A [2]Catenane-Based Solid State Electronically Reconfigurable Switch," Science, vol. 289, pp. 1172-1175, 2000.
Y. Naitoh et al., "Resistance switch employing a simple metal nanogap junction," Nanotechnology, vol. 17, pp. 5669-5674, 2006.
Japanese Office Action issued on Jan. 5, 2010 for corresponding Japanese Patent Application 2008-117459.

* cited by examiner

*Primary Examiner* — Son T Dinh
*Assistant Examiner* — Toan Le
(74) *Attorney, Agent, or Firm* — K&L Gates LLP

(57) ABSTRACT

An electronic device includes: a first conductor; an insulative supporting film formed in a part on one surface of the first conductor; and a second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is larger than a space between the first conductor and the second conductor, at least a part of which forms the air gap.

14 Claims, 15 Drawing Sheets

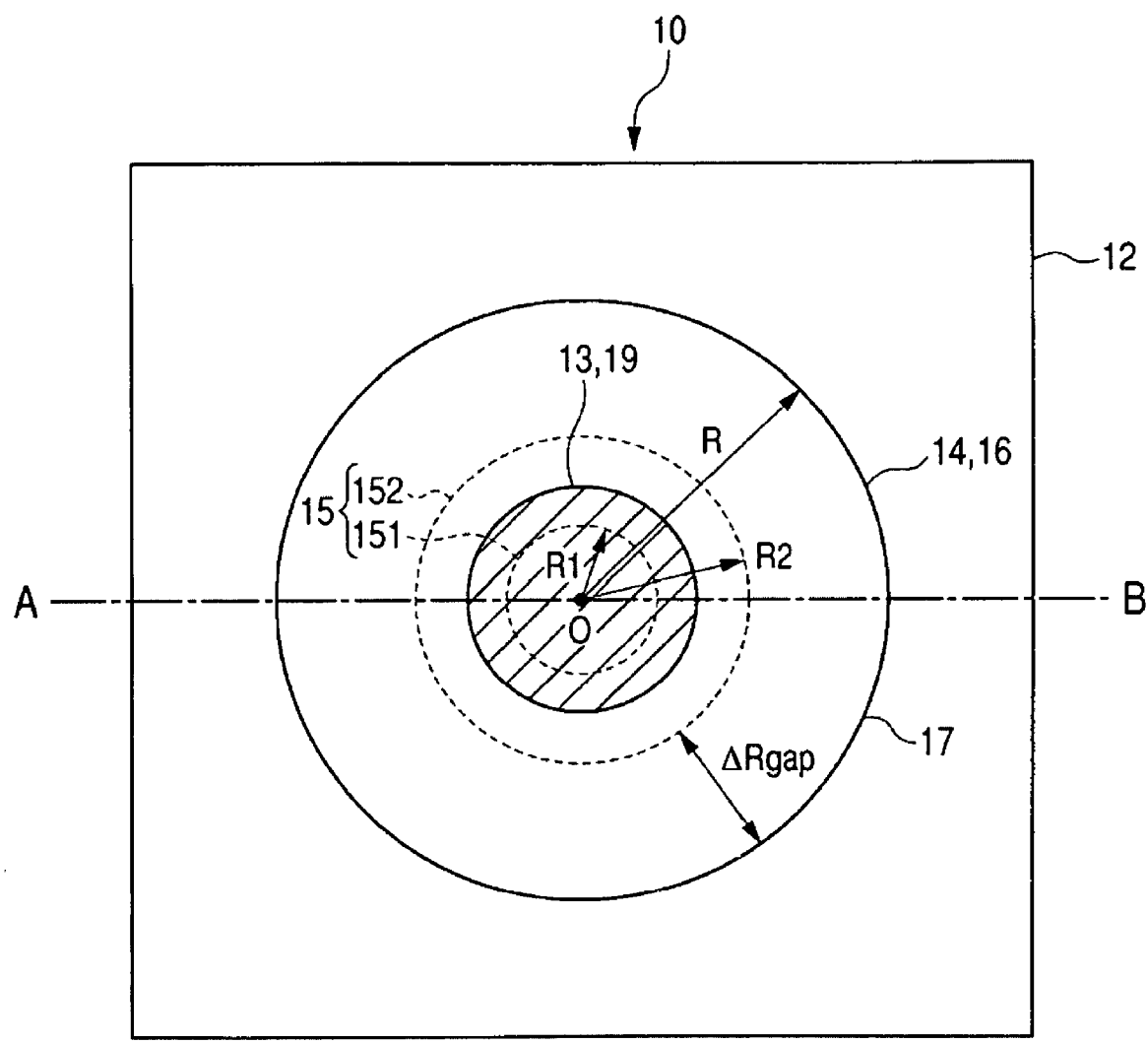

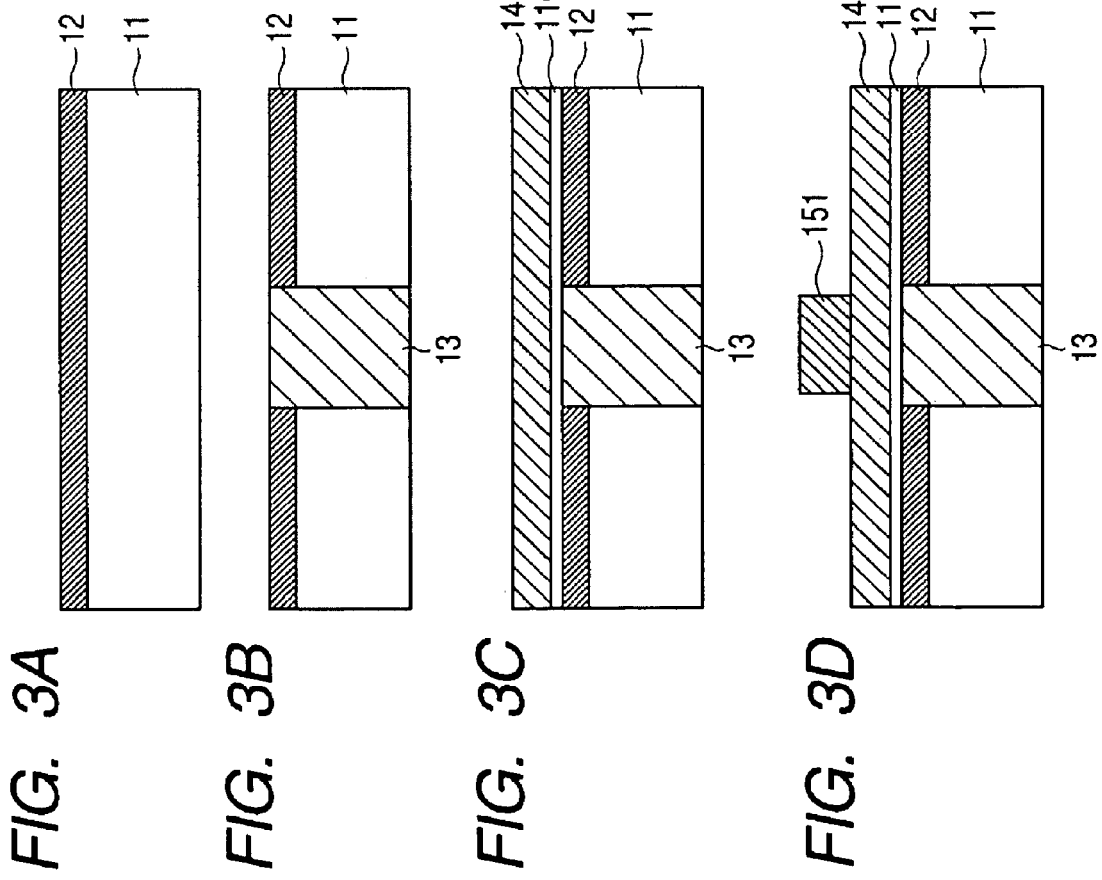

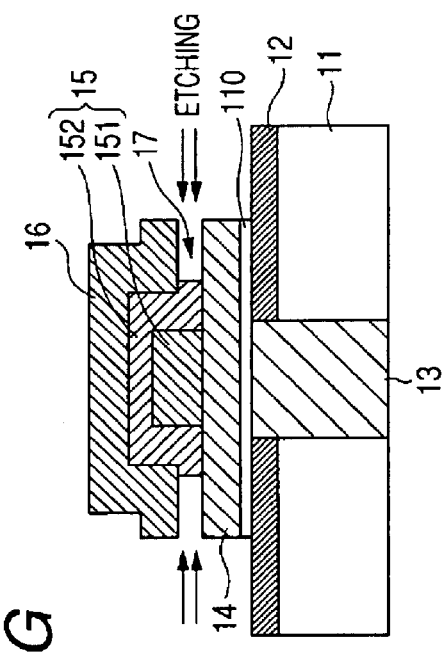
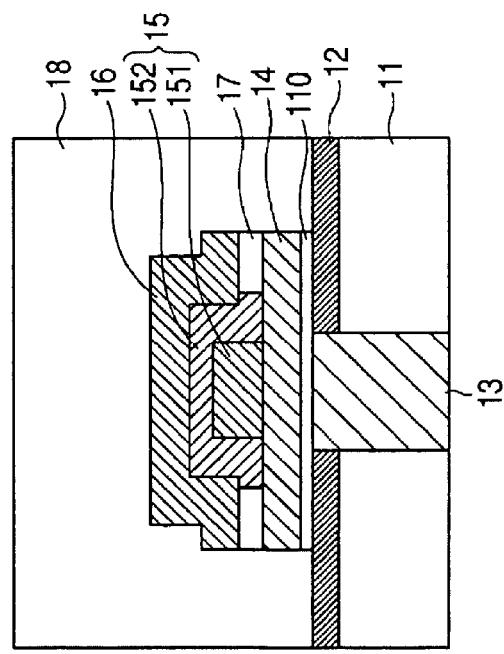
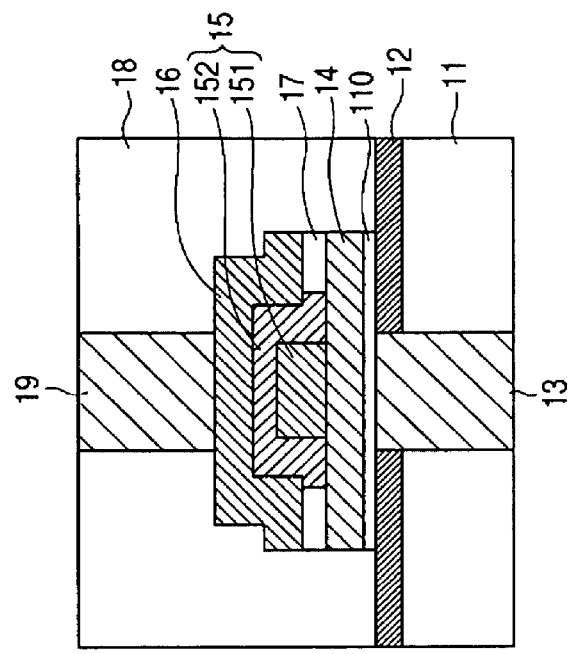

ELECTRONIC DEVICE, METHOD OF MANUFACTURING THE SAME, AND STORAGE DEVICE

CROSS-REFERENCES TO RELATED APPLICATIONS

The present application claims priority to Japanese Patent Applications JP 2008-013886 and JP 2008-117459 filed in the Japanese Patent Office on Jan. 24, 2008 and Apr. 28, 2008, respectively, the entire contents of which are being incorporated herein by reference.

BACKGROUND

The present application relates to an electronic device, a method of manufacturing the same, and a storage device that make use of a phenomenon in which, for example, when voltage is applied to an air gap formed by two conductors, a change occurs in the resistance between the conductors.

As an electronic device that is electrically rewritable and maintains a memory state even if a power supply is turned off, there is a flash memory (or a flash ROM). The flash memory is an electronic device that has a storage cell including one floating-gate transistor and is characterized by low bit cost. The flash memory is considered to be further advanced in scaling for the storage cell in order to realize bit cost advantageous for memories of other specifications.

However, such a flash memory may cause a phenomenon in which charges accumulated in a floating gate electrode are erased by a leak current of a tunnel oxide film generated according to an increase in the number of times of rewriting of data. This phenomenon rapidly increases according to thin-filming of an oxide film. Therefore, the scaling of the storage cell is not easy and scaling not depending on the thin-filming needs to be performed.

From the viewpoint explained above, researches and developments of nano-structure represented by functional organic molecules and ultra-micro particles have been actively carried out. The researches and developments are applied to refining of electronic devices. As an application of the nano-structure, there is an electronic device in which, for example, two electrodes are arranged across a micro air gap (gap; hereinafter referred to as gap) and the gap is bridged by functional organic molecules.

In 'A [2] Catenane-Based Solid State Electronically Reconfigurable Switch', Charles P. Collier, et al., Science, Vol. 289, pp. 1172-1175 (2000) (Non-Patent Document 1), an electronic device in which a catenane-based molecules are arranged in a gap of electrodes formed of platinum is disclosed. According to Non-Patent Document 1, when voltage is applied between the electrodes, the catenane-based molecules are subjected to the oxidation-reduction reaction and perform a switching action.

As other applications of the nano-structure to electronic devices, there are disclosed a method of manufacturing a nanogap electrode having a gap space of about several nanometers (see, for example, JP-A-2005-79335 (Patent Document 1) and JP-A-2006-234799 (Patent Document 2) and an electronic device in which voltage is applied to a gap between metals to which only a tunnel current flows and a hysteresis effect appearing in resistance is applied to a switching action (see, for example, 'Resistance switch employing a simple metal nanogap junction', Yasuhisa Naitoh, et al., Nanotechnology, Vol. 17, pp. 5669-5674 (2006) (Non-Patent Document 2) and JP-A-2007-123828 (Patent Document 3)).

SUMMARY

In the electronic device disclosed in Non-Patent Document 1, special composite molecules and complicated metal complex are used between the electrodes. The electronic device makes use of a chemical reaction in the molecules or a reaction between exotic atoms. Therefore, the electronic device has dependency in the direction of the applied voltage between the electrodes and there is a limit in use of the electronic device. Since the electronic device makes use of a chemical reaction for a switch action, there is a drawback in that deterioration in the electronic device tends to occur. It is difficult to sufficiently reduce the gap between the electrodes.

The manufacturing method disclosed in Patent Document 1 is a manufacturing method employing oblique deposition. Therefore, there is a drawback in that stability is extremely poor and productivity is low.

In the electronic device disclosed in Non-Patent Document 2 and Patent Document 3, an electrode portion thereof needs to be sealed by a package. Therefore, high integration is difficult. Moreover, since a method of manufacturing the electronic device is the method according to Patent Document 1, it is also difficult to perform stable manufacturing.

The method of manufacturing a nanogap electrode disclosed in Patent Document 2 has a drawback in that it is difficult to adjust a space of the gaps.

Therefore, it is desirable to provide an electronic device that has extremely simple structure and can be stably manufactured and highly integrated, a method of manufacturing the same, and a storage device including the electronic device.

According to an embodiment, there is provided an electronic device including: a first conductor; an insulative supporting film formed in a part on one surface of the first conductor; and a second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is larger than a space between the first conductor and the second conductor, at least a part of which forms the air gap.

Preferably, the supporting film includes: an insulative substrate film that is stacked on the first conductor and supports the second conductor; and an insulative adjusting film that is stacked on at least an upper layer surface of the substrate film and adjusts the space between the first conductor and the second conductor.

According to another embodiment, there is provided an electronic device including: a first conductor; an insulative supporting film formed in a part on one surface of the first conductor; and a second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is thickness that can suppress an electric current flowing to the air gap, and the thickness of the air gap is smaller than the thickness of the supporting film.

Preferably, the supporting film is formed in the center of the first conductor and the second conductor, and the air gap is formed in an outer periphery of the first conductor and the second conductor around the supporting film.

Preferably, the electronic device includes: a first terminal connected to the first conductor; and a second terminal connected to the second conductor, and the first and second conductors and the supporting film are arranged to be on the same line.

Preferably, the first conductor and the second conductor have the same area.

Preferably, the supporting film is formed of silicon oxide ($SiO_2$).

According to still another embodiment, there is provided a method of manufacturing an electronic device including the steps of: forming an insulative supporting film on one surface of a first conductor; forming a second conductor on the supporting film; and removing a part of the supporting film formed between the first conductor and the second conductor to form an air gap.

According to still another embodiment, there is provided a storage device including: an electronic device, a conduction state of which changes when a first conductor and a second conductor are subjected to voltage equal to or higher than threshold voltage; plural cells that include first wiring layers connected to the first conductor and second wiring layers connected to the second conductor and are arrayed in a matrix shape; a first voltage supplying circuit to which the first wiring layers are connected in common, the first voltage supplying circuit applying first voltage to the first wiring layer of the cell to which voltage is applied; and a second voltage supplying circuit to which the second wiring layers are connected in common, the second voltage supplying circuit applying second voltage to the second wiring layer of the cell to which voltage is applied. The first and second voltage supplying circuits can supply the first and second voltages, respectively, such that a difference between voltages applied to the first conductor and the second conductor is selectively equal to or higher than the threshold voltage in the cell to which voltage is applied. The electronic device includes: the first conductor; an insulative supporting film formed in a part on one surface of the first conductor; and the second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is larger than a space between the first conductor and the second conductor, at least a part of which forms the air gap.

According to still another embodiment, there is provided a storage device including: an electronic device, a conduction state of which changes when a first conductor and a second conductor are subjected to voltage equal to or higher than threshold voltage; plural cells that include first wiring layers connected to the second conductor, second wiring layers, transistors connected in series between the first conductor and the second wiring layers, and third wiring layers connected to gates of the transistors and are arrayed in a matrix shape; a first voltage supplying circuit to which the third wiring layers are connected in common, the first voltage supplying circuit applying first voltage to the third wiring layer of the cell to which voltage is applied; a second voltage supplying circuit to which the first wiring layers are connected in common, the second voltage supplying circuit applying second voltage to the first wiring layer of the cell to which voltage is applied; and a third voltage supplying circuit to which the second wiring layers are connected in common, the third voltage supplying circuit applying third voltage to the second wiring layer of the cell to which voltage is applied. The first voltage supplying circuit can supply voltage for turning on the transistors. The second and third voltage supplying circuits can supply the second and third voltages, respectively, such that a difference between voltages applied to the first conductor and the second conductor is selectively equal to or higher than the threshold voltage in the cell to which voltage is applied. The electronic device includes: the first conductor; an insulative supporting film formed in a part on one surface of the first conductor; and the second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is larger than a space between the first conductor and the second conductor, at least a part of which forms the air gap.

According to still another embodiment, there is provided a storage device including: an electronic device, a conduction state of which changes when a first conductor and a second conductor are subjected to voltage equal to or higher than threshold voltage; plural cells that include first wiring layers connected to the second conductor, second wiring layers, and a diode connected in series between the first conductor and the second wiring layers and are arrayed a matrix shape; a first voltage supplying circuit to which the second wiring layers are connected in common, the first voltage supplying circuit applying first voltage to the second wiring layer of the cell to which voltage is applied; and a second voltage supplying circuit to which the first wiring layers are connected in common, the second voltage supplying circuit applying second voltage to the first wiring layer of the cell to which voltage is applied. The first and second voltage supplying circuits can supply the first and second voltages, respectively, such that a difference between voltages applied to the first conductor and the second conductor is selectively equal to or higher than the threshold voltage in the cell to which voltage is applied. The electronic device includes: the first conductor; an insulative supporting film formed in a part on one surface of the first conductor; and the second conductor, one surface of which is opposed to the one surface of the first conductor and a part of which is supported by the supporting film. An air gap is formed in a region in which the first conductor and the second conductor are opposed to each other excluding the supporting film. The thickness of the supporting film is larger than a space between the first conductor and the second conductor, at least a part of which forms the air gap.

According to an embodiment, the insulative supporting film is formed in a part on one surface of the first conductor. The second conductor is formed such that one surface thereof is opposed to the one surface of the first conductor and a part thereof is supported by the supporting film. The air gap is formed in the region in which the first conductor and the second conductor are opposed to each other excluding the supporting film. The thickness of the supporting film is larger than the space between the first conductor and the second conductor, at least a part of which forms the air gap.

According to an embodiment, it is possible to provide an electronic device that has extremely simple structure and can be stably manufactured and highly integrated, a method of manufacturing the same, and a storage device including the electronic device.

Additional features and advantages are described herein, and will be apparent from the following Detailed Description and the figures.

BRIEF DESCRIPTION OF THE FIGURES

FIG. 2 is a plan view of the electronic device shown in FIG. 1;

FIGS. 3A to 3I are schematic diagrams for explaining a method of manufacturing the electronic device according to the first embodiment;

DETAILED DESCRIPTION

The present application is described in detail below with reference to the accompanying drawings according to an embodiment.

First Embodiment

An electronic device according to a first embodiment is explained. First, a main part of the electronic device is explained.

Figure 1:
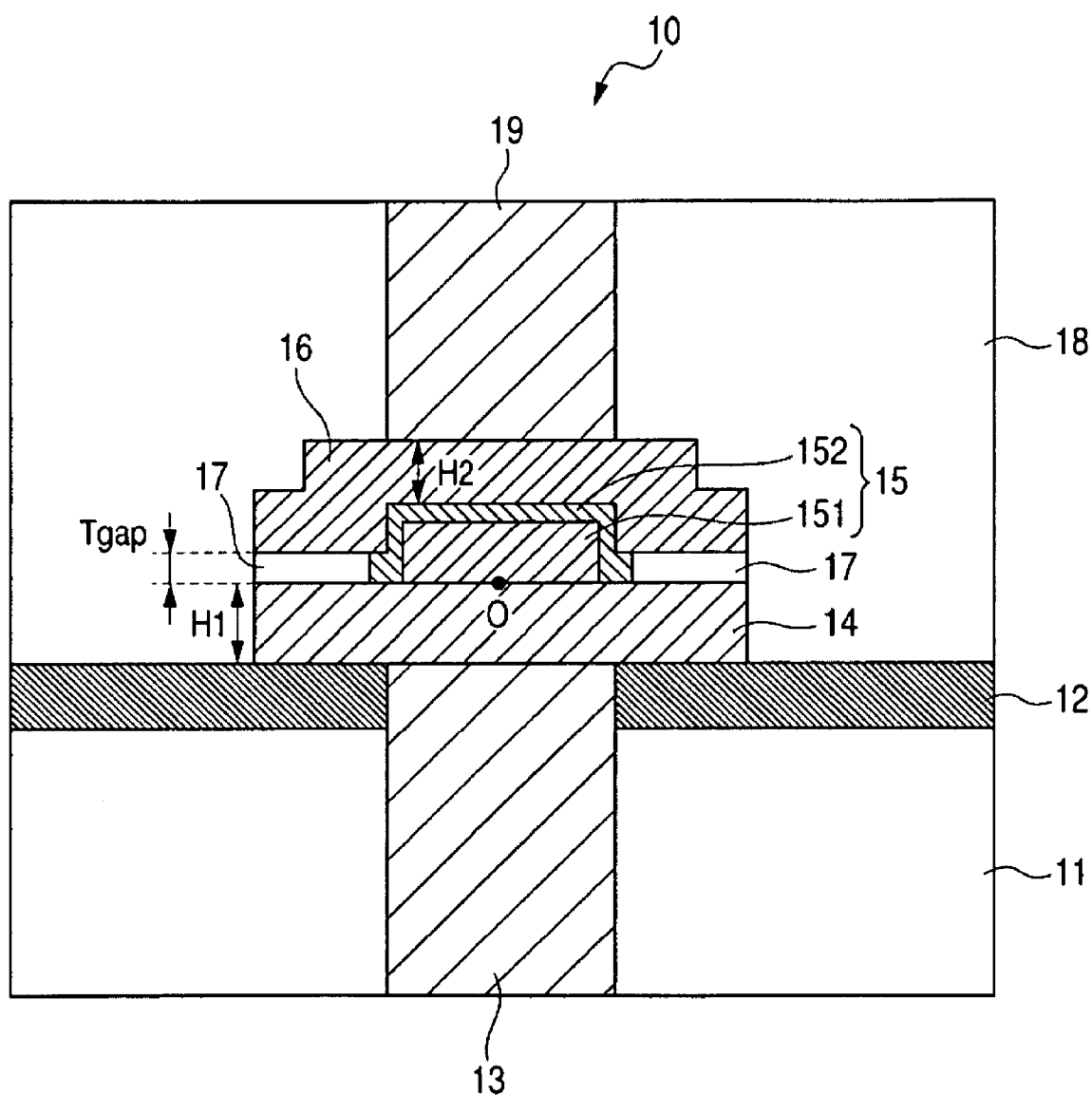
FIG. 1 is sectional view of an example of a main part of an electronic device according to a first embodiment of the present application.

FIG. 1 is a sectional view of an example of the main part of the electronic device according to this embodiment. FIG. 2 is a plan view of the electronic device shown in FIG. 1. A sectional view taken along a broken line A-B in FIG. 2 is FIG. 1. A part of the electronic device such as an insulating film is not shown in FIG. 2.

As shown in FIG. 1, an electronic device 10 includes an interlayer insulating film 11, an etching preventing film 12, a first contact hole (a first terminal) 13, a first electrode (a first conductor) 14, a supporting film 15, a second electrode (a second conductor) 16, a gap (an air gap) 17, an insulating film 18, and a second contact hole (a second terminal) 19. The supporting film 15 is multilayered and includes a substrate film 151 and an adjusting film 152.

In the electronic device 10, both the contact holes 13 and 19 and the supporting film 15 are arranged on substantially the same vertical line as shown in FIG. 1 and are arranged in the center of both the electrodes 14 and 16 as shown in FIG. 2. The respective components are explained below.

As shown in FIG. 1, the interlayer insulating film 11 is formed on a not-shown semiconductor substrate. The interlayer insulating film 11 is formed of insulative silicon oxide ($SiO_2$, hereinafter referred to as $SiO_2$). A material of the interlayer insulating film 11 is not specifically limited as long as the material is an insulator.

A configuration and the like of the semiconductor substrate are not specifically limited. However, as explained later, lower wiring layers, transistors, and the like are suitably formed on the semiconductor substrate.

The etching preventing film 12 is formed on the interlayer insulating film 11 to prevent etching. The etching preventing film 12 is formed of insulative silicon nitride (SiN, hereinafter referred to as SiN). However, the etching preventing film 12 is not formed of, for example, oxide aluminum (alumina, $Al_2O_3$). A material of the etching preventing film 12 is not specifically limited as long as the material is an insulator.

The first contact hole 13 is opened in a part of the interlayer insulating film 11 and the etching preventing film 12 as shown in FIG. 1 in order to electrically connect (hereinafter simply referred to as connect) the first electrode 14 and wiring layers and the like of a not-shown semiconductor substrate. Conductive tungsten (W) is filled in the inside of the first contact hole 13. The first contact hole 13 is opened in a circular shape near the center (the center O) of an electrode surface of the first electrode 14 as indicated by a hatched portion shown in FIG. 2.

The first electrode 14 is formed on a not-shown base layer formed on the first etching preventing film 12 as shown in FIG. 1 and is formed in a circular shape as shown in FIG. 2. The thickness H1 of the first electrode 14 is about 30 nm. An electrode area S1 of the first electrode 14 is suitably set. As shown in FIG. 2, an electrode radius R of the first electrode 14 is set to about 75 nm and the electrode area S1 depends on $\pi R^2$ ($\pi$ is a pie-times function) and is about $1.8 \times 10^3$ $nm^2$. In order to connect the first electrode 14 to the wiring layers and the like of the not-shown semiconductor substrate, the first electrode 14 is connected to the first contact hole 13 via the base layer in the center of the electrode.

The first electrode 14 is formed of conductive gold (Au). However, a material of the first electrode 14 is not specifically limited as long as the material is a conductor. The thickness H1 and the electrode radius R are not limited to this embodiment.

In order to form a gap 17 in inter-electrode formed by the first electrode 14 and the second electrode 16 (hereinafter simply referred to as "inter-electrode"), the supporting film 15 is stacked on the electrode surface of the first electrode 14 as shown in FIG. 1 such that the thickness thereof is large in the center in the radial direction thereof. The supporting film 15 supports the second electrode 16. In terms of a plane, as shown in FIG. 2, the thickness is set large (about 10 nm to 12 nm) near the region of both the contact holes 13 and 19 and the thickness is set smaller (about 3 nm to 7 nm) near an inner circumferential side of the gap 17 (a region at a distant equivalent to a radius R2).

The thickness is set large in the center in the radial direction in this way in order to, when voltage equal to or higher than predetermined threshold voltage is applied to the inter-electrode, suppress a tunnel current in the center of the supporting film 15 and feed the tunnel current only to the gap 17 explained later. In this embodiment, it is desirable that the threshold voltage is about 3.8 V and the thickness is equal to or larger than about 10 nm in order to suppress a leak current in the supporting film 15.

The supporting film 15 is formed of insulative $SiO_2$. In this embodiment, as explained later, the multilayer structure including the substrate film 151 and the adjusting film 152 is adopted.

The substrate film 151 is formed of insulative $SiO_2$ on the surface of the first electrode 14 as shown in FIG. 1. The supporting film 15 is covered with the adjusting film 152. The substrate film 151 is formed in the center of the supporting film 15 and plays a role of structurally supporting the second electrode 16. Specifically, the supporting film 15 is formed in a region at a distance equivalent to a radius R1 from the center O as shown in FIG. 2. The thickness of the supporting film 15 is about 7 nm.

The radium R1 is slightly smaller than the radius of both the contact holes 13 and 19. However, the radius R1 can be suitably set and may be any length as long as the structure of both the electrodes can be maintained.

The adjusting film 152 is formed of insulative $SiO_2$ to cover the supporting film 151 as shown in FIG. 1. An upper layer of the surface forming the adjusting film 152 is in contact with the second electrode 16. The adjusting film 152 plays a role for adjusting a space in the inter-electrode. Specifically, as shown in FIG. 2, the adjusting film 152 is formed in a region of a distance equivalent to a radius R2 from the center O. The thickness of the adjusting film 152 is about 5 nm.

The radius R2 is a distance near the inner circumferential side of the gap 17. However, the radius R2 can be suitably set according to etching explained later.

As shown in FIG. 1, the second electrode 16 is formed on the supporting film 15 and, more specifically, on the adjusting film 152. As shown in FIG. 2, the second electrode 16 is formed in a circular shape in the same manner as the first electrode 14. The thickness H2 of the second electrode 16 is about 30 nm.

As explained in detail later, as shown in FIG. 2, the second electrode 16 has an electrode area that can be regarded the same as that of the first electrode 14. Therefore, the radius of the second electrode 16 may be regarded the same as the electrode radius R of the first electrode 14. In order to connect the second electrode 16 to wiring layers and the like of a not-shown upper layer, the second electrode 16 is connected to the second contact hole 19 in the center of the electrode.

The second electrode 16 is formed of conductive gold (Au). However, a material of the second electrode 16 is not specifically limited as long as the material is a conductor. The thickness H2 is not limited to the embodiment.

The gap 17 is a gap in a nano-scale that is caused because the supporting film 15 on the first electrode 14 supports the second electrode 16 as shown in FIG. 1. The gap 17 has a gap space Tgap shown in FIG. 1 and gap width ΔRgap shown in FIG. 2 and is formed in a doughnut shape around the supporting film 15. The gap width ΔRgap occupies 30% to 60% of the electrode radius R. The gap space Tgap is suitably set according to a material, applied voltage, and the like of both the electrodes 14 and 16. In this embodiment, the gap space Tgap is about 4 nm. The gap width ΔRgap is also suitably set. In this embodiment, the gap width ΔRgap is about 40 nm.

Such a gap 17 is formed in the inter-electrode, a quantum mechanical tunnel effect is caused by the application of voltage equal to or higher than the predetermined threshold voltage to the inter-electrode, and a tunnel current flows to the inter-electrode (e.g., from the second electrode 16 to the first electrode 14).

The gap space Tgap needs to be slightly larger than a space with which the tunnel current starts to flow. However, the gap space Tgap has to be a space with which an electric field is generated in the inter-electrode forming the gap 17, the gap space Tgap slightly changes according to the movement of metal atoms on the electrode surface due to the electric field, and the tunnel current easily starts to flow.

As shown in FIG. 1, the insulating film 18 is formed around both the electrodes 14 and 16 and the second contact hole 19 on the etching preventing film 12. The insulating film 18 is formed of insulative $SiO_2$. However, a material of the insulating film 18 is not specifically limited as long as the material is an insulator. In FIG. 2, the insulating film 18 is not shown.

The second contact hole 19 is opened in a part of the insulating film 18 as shown in FIG. 1 in order to connect the second electrode 16 and the wiring layers and the like of the not-shown upper layer. For example, conductive tungsten (W) is filled in the inside of the second contact hole 19. The second contact hole 19 is opened in a circular shape near the center (the center O) of both the electrodes 14 and 16 as indicated by the hatched portion shown FIG. 2.

A method of manufacturing the electronic device 10 is explained with reference to an example.

FIGS. 3A to 3I are schematic diagrams for explaining a method of manufacturing an electronic device according to this embodiment. FIGS. 3A to 3I are sectional views taken along a line A-B indicated by a broken line shown in FIG. 2.

First Step ST1

On a semiconductor substrate not shown in FIG. 3A, for example, transistors and wiring layers are formed. As shown in FIG. 3A, an insulating film of $SiO_2$, which becomes interlayer insulating film 11, is formed on the transistors of the semiconductor substrate by any one of the oxidation treatment method and the chemical vapor deposition (CVD) method.

An insulating film of SiN, which becomes the etching preventing film 12, is formed on the interlayer insulating film 11 by the same method.

The etching preventing film 12 is formed in order to prevent the interlayer insulating film 11 in a lower layer from being etched when the insulating film of $SiO_2$ formed in the portion of the gap 17 is chemically etched in a later step.

Second Step ST2

As shown in FIG. 3B, a part of the interlayer insulating film 11 and the etching preventing film 12 is opened, conductive tungsten (W) is filled in the inside of the interlayer insulating film 11 and the etching preventing film 12, and the surface of the etching preventing film 12 is planarized by chemical mechanical polishing or the like.

Third Step ST3

As shown in FIG. 3C, a film of titanium, which becomes the base layer 110, is formed in the thickness of about 10 nm on the etching preventing film 12 by the chemical vapor deposition method.

A film (a layer) of gold, which becomes the first electrode 14, is formed in the thickness of about 30 nm on the base layer 110 by the sputtering method.

Fourth Step ST4

An insulating film of $SiO_2$, which becomes the substrate film 151, is formed in the thickness of about 7 nm on the first electrode 14 by the chemical vapor deposition method.

As shown in FIG. 3D, the insulating film other than a portion for supporting the second electrode 16 is removed by a method such as the photolithography method or the etching method to form the substrate film 151.

The method used in this step is not specifically limited.

Fifth Step ST5

As shown in FIG. 3E, an insulating film of $SiO_2$, which becomes the adjusting film 152, is formed in the thickness of about 4 nm on the first electrode 14 to cover the substrate film 151 by one of the sputtering method and the chemical vapor deposition method. The gap space Tgap is adjusted to about 4 nm by suitably adjusting the thickness of the adjusting film 152 (see FIG. 1).

A film (a layer) of gold, which becomes the second electrode 16, is formed in the thickness of about 30 nm on the adjusting film 152 by the same method.

Both the electrodes 14 and 16, electrode surfaces of which are opposed to each other, are formed by performing this step.

Sixth Step ST6

As shown in FIG. 3F, a laminated film formed by the base layer 110, the first electrode 14, the substrate film 151, the adjusting film 152, and the second electrode 16 (in the explanation of steps below, simply referred to as laminated film) is etched into a predetermined shape by a method such as the photolithography method or the etching method. In this embodiment, the laminated film is etched into a circular shape with a diameter of about 150 nm (the electrode radius R=75 mm) shown in FIG. 2.

In this step, since the laminated film is collectively etched as shown in the figure, electrode areas of both the electrodes 14 and 16 can be regarded the same.

The method of etching used in this step is not specifically limited. However, when gold is etched, the ion milling method is desirable.

The present application is described in detail below with reference to the accompanying drawings according to an embodiment.

First Embodiment

An electronic device according to a first embodiment is explained. First, a main part of the electronic device is explained.

FIG. 1 is a sectional view of an example of the main part of the electronic device according to this embodiment. FIG. 2 is a plan view of the electronic device shown in FIG. 1. A sectional view taken along a broken line A-B in FIG. 2 is FIG. 1. A part of the electronic device such as an insulating film is not shown in FIG. 2.

As shown in FIG. 1, an electronic device 10 includes an interlayer insulating film 11, an etching preventing film 12, a first contact hole (a first terminal) 13, a first electrode (a first conductor) 14, a supporting film 15, a second electrode (a second conductor) 16, a gap (an air gap) 17, an insulating film 18, and a second contact hole (a second terminal) 19. The supporting film 15 is multilayered and includes a substrate film 151 and an adjusting film 152.

In the electronic device 10, both the contact holes 13 and 19 and the supporting film 15 are arranged on substantially the same vertical line as shown in FIG. 1 and are arranged in the center of both the electrodes 14 and 16 as shown in FIG. 2. The respective components are explained below.

As shown in FIG. 1, the interlayer insulating film 11 is formed on a not-shown semiconductor substrate. The interlayer insulating film 11 is formed of insulative silicon oxide ($SiO_2$, hereinafter referred to as $SiO_2$). A material of the interlayer insulating film 11 is not specifically limited as long as the material is an insulator.

A configuration and the like of the semiconductor substrate are not specifically limited. However, as explained later, lower wiring layers, transistors, and the like are suitably formed on the semiconductor substrate.

The etching preventing film 12 is formed on the interlayer insulating film 11 to prevent etching. The etching preventing film 12 is formed of insulative silicon nitride (SiN, hereinafter referred to as SiN). However, the etching preventing film 12 is not formed of, for example, oxide aluminum (alumina, $Al_2O_3$). A material of the etching preventing film 12 is not specifically limited as long as the material is an insulator.

The first contact hole 13 is opened in a part of the interlayer insulating film 11 and the etching preventing film 12 as shown in FIG. 1 in order to electrically connect (hereinafter simply referred to as connect) the first electrode 14 and wiring layers and the like of a not-shown semiconductor substrate. Conductive tungsten (W) is filled in the inside of the first contact hole 13. The first contact hole 13 is opened in a circular shape near the center (the center O) of an electrode surface of the first electrode 14 as indicated by a hatched portion shown in FIG. 2.

The first electrode 14 is formed on a not-shown base layer formed on the first etching preventing film 12 as shown in FIG. 1 and is formed in a circular shape as shown in FIG. 2. The thickness H1 of the first electrode 14 is about 30 nm. An electrode area S1 of the first electrode 14 is suitably set. As shown in FIG. 2, an electrode radius R of the first electrode 14 is set to about 75 nm and the electrode area S1 depends on $\pi R^2$ ($\pi$ is a pie-times function) and is about $1.8 \times 10^3$ nm$^2$. In order to connect the first electrode 14 to the wiring layers and the like of the not-shown semiconductor substrate, the first electrode 14 is connected to the first contact hole 13 via the base layer in the center of the electrode.

The first electrode 14 is formed of conductive gold (Au). However, a material of the first electrode 14 is not specifically limited as long as the material is a conductor. The thickness H1 and the electrode radius R are not limited to this embodiment.

In order to form a gap 17 in inter-electrode formed by the first electrode 14 and the second electrode 16 (hereinafter simply referred to as "inter-electrode"), the supporting film 15 is stacked on the electrode surface of the first electrode 14 as shown in FIG. 1 such that the thickness thereof is large in the center in the radial direction thereof. The supporting film 15 supports the second electrode 16. In terms of a plane, as shown in FIG. 2, the thickness is set large (about 10 nm to 12 nm) near the region of both the contact holes 13 and 19 and the thickness is set smaller (about 3 nm to 7 nm) near an inner circumferential side of the gap 17 (a region at a distant equivalent to a radius R2).

The thickness is set large in the center in the radial direction in this way in order to, when voltage equal to or higher than predetermined threshold voltage is applied to the inter-electrode, suppress a tunnel current in the center of the supporting film 15 and feed the tunnel current only to the gap 17 explained later. In this embodiment, it is desirable that the threshold voltage is about 3.8 V and the thickness is equal to or larger than about 10 nm in order to suppress a leak current in the supporting film 15.

The supporting film 15 is formed of insulative $SiO_2$. In this embodiment, as explained later, the multilayer structure including the substrate film 151 and the adjusting film 152 is adopted.

The substrate film 151 is formed of insulative $SiO_2$ on the surface of the first electrode 14 as shown in FIG. 1. The supporting film 15 is covered with the adjusting film 152. The substrate film 151 is formed in the center of the supporting film 15 and plays a role of structurally supporting the second electrode 16. Specifically, the supporting film 15 is formed in a region at a distance equivalent to a radius R1 from the center O as shown in FIG. 2. The thickness of the supporting film 15 is about 7 nm.

The radium R1 is slightly smaller than the radius of both the contact holes 13 and 19. However, the radius R1 can be suitably set and may be any length as long as the structure of both the electrodes can be maintained.

The adjusting film 152 is formed of insulative $SiO_2$ to cover the supporting film 151 as shown in FIG. 1. An upper layer of the surface forming the adjusting film 152 is in contact with the second electrode 16. The adjusting film 152 plays a role for adjusting a space in the inter-electrode. Specifically, as shown in FIG. 2, the adjusting film 152 is formed in a region of a distance equivalent to a radius R2 from the center O. The thickness of the adjusting film 152 is about 5 nm.

The radius R2 is a distance near the inner circumferential side of the gap 17. However, the radius R2 can be suitably set according to etching explained later.

As shown in FIG. 1, the second electrode 16 is formed on the supporting film 15 and, more specifically, on the adjusting film 152. As shown in FIG. 2, the second electrode 16 is formed in a circular shape in the same manner as the first electrode 14. The thickness H2 of the second electrode 16 is about 30 nm.

As explained in detail later, as shown in FIG. 2, the second electrode 16 has an electrode area that can be regarded the same as that of the first electrode 14. Therefore, the radius of the second electrode 16 may be regarded the same as the electrode radius R of the first electrode 14. In order to connect the second electrode 16 to wiring layers and the like of a not-shown upper layer, the second electrode 16 is connected to the second contact hole 19 in the center of the electrode.

The second electrode 16 is formed of conductive gold (Au). However, a material of the second electrode 16 is not specifically limited as long as the material is a conductor. The thickness H2 is not limited to the embodiment.

The gap 17 is a gap in a nano-scale that is caused because the supporting film 15 on the first electrode 14 supports the second electrode 16 as shown in FIG. 1. The gap 17 has a gap space Tgap shown in FIG. 1 and gap width ΔRgap shown in FIG. 2 and is formed in a doughnut shape around the supporting film 15. The gap width ΔRgap occupies 30% to 60% of the electrode radius R. The gap space Tgap is suitably set according to a material, applied voltage, and the like of both the electrodes 14 and 16. In this embodiment, the gap space Tgap is about 4 nm. The gap width ΔRgap is also suitably set. In this embodiment, the gap width ΔRgap is about 40 nm.

Such a gap 17 is formed in the inter-electrode, a quantum mechanical tunnel effect is caused by the application of voltage equal to or higher than the predetermined threshold voltage to the inter-electrode, and a tunnel current flows to the inter-electrode (e.g., from the second electrode 16 to the first electrode 14).

The gap space Tgap needs to be slightly larger than a space with which the tunnel current starts to flow. However, the gap space Tgap has to be a space with which an electric field is generated in the inter-electrode forming the gap 17, the gap space Tgap slightly changes according to the movement of metal atoms on the electrode surface due to the electric field, and the tunnel current easily starts to flow.

As shown in FIG. 1, the insulating film 18 is formed around both the electrodes 14 and 16 and the second contact hole 19 on the etching preventing film 12. The insulating film 18 is formed of insulative $SiO_2$. However, a material of the insulating film 18 is not specifically limited as long as the material is an insulator. In FIG. 2, the insulating film 18 is not shown.

The second contact hole 19 is opened in a part of the insulating film 18 as shown in FIG. 1 in order to connect the second electrode 16 and the wiring layers and the like of the not-shown upper layer. For example, conductive tungsten (W) is filled in the inside of the second contact hole 19. The second contact hole 19 is opened in a circular shape near the center (the center O) of both the electrodes 14 and 16 as indicated by the hatched portion shown FIG. 2.

A method of manufacturing the electronic device 10 is explained with reference to an example.

FIGS. 3A to 3I are schematic diagrams for explaining a method of manufacturing an electronic device according to this embodiment. FIGS. 3A to 3I are sectional views taken along a line A-B indicated by a broken line shown in FIG. 2.

First Step ST1

On a semiconductor substrate not shown in FIG. 3A, for example, transistors and wiring layers are formed. As shown in FIG. 3A, an insulating film of $SiO_2$, which becomes the interlayer insulating film 11, is formed on the transistors of the semiconductor substrate by any one of the oxidation treatment method and the chemical vapor deposition (CVD) method.

An insulating film of SiN, which becomes the etching preventing film 12, is formed on the interlayer insulating film 11 by the same method.

The etching preventing film 12 is formed in order to prevent the interlayer insulating film 11 in a lower layer from being etched when the insulating film of $SiO_2$ formed in the portion of the gap 17 is chemically etched in a later step.

Second Step ST2

As shown in FIG. 3B, a part of the interlayer insulating film 11 and the etching preventing film 12 is opened, conductive tungsten (W) is filled in the inside of the interlayer insulating film 11 and the etching preventing film 12, and the surface of the etching preventing film 12 is planarized by chemical mechanical polishing or the like.

Third Step ST3

As shown in FIG. 3C, a film of titanium, which becomes the base layer 110, is formed in the thickness of about 10 nm on the etching preventing film 12 by the chemical vapor deposition method.

A film (a layer) of gold, which becomes the first electrode 14, is formed in the thickness of about 30 nm on the base layer 110 by the sputtering method.

Fourth Step ST4

An insulating film of $SiO_2$, which becomes the substrate film 151, is formed in the thickness of about 7 nm on the first electrode 14 by the chemical vapor deposition method.

As shown in FIG. 3D, the insulating film other than a portion for supporting the second electrode 16 is removed by a method such as the photolithography method or the etching method to form the substrate film 151.

The method used in this step is not specifically limited.

Fifth Step ST5

As shown in FIG. 3E, an insulating film of $SiO_2$, which becomes the adjusting film 152, is formed in the thickness of about 4 nm on the first electrode 14 to cover the substrate film 151 by one of the sputtering method and the chemical vapor deposition method. The gap space Tgap is adjusted to about 4 nm by suitably adjusting the thickness of the adjusting film 152 (see FIG. 1).

A film (a layer) of gold, which becomes the second electrode 16, is formed in the thickness of about 30 nm on the adjusting film 152 by the same method.

Both the electrodes 14 and 16, electrode surfaces of which are opposed to each other, are formed by performing this step.

Sixth Step ST6

As shown in FIG. 3F, a laminated film formed by the base layer 110, the first electrode 14, the substrate film 151, the adjusting film 152, and the second electrode 16 (in the explanation of steps below, simply referred to as laminated film) is etched into a predetermined shape by a method such as the photolithography method or the etching method. In this embodiment, the laminated film is etched into a circular shape with a diameter of about 150 nm (the electrode radius R=75 nm) shown in FIG. 2.

In this step, since the laminated film is collectively etched as shown in the figure, electrode areas of both the electrodes 14 and 16 can be regarded the same.

The method of etching used in this step is not specifically limited. However, when gold is etched, the ion milling method is desirable.

Seventh Step ST7

As shown in FIG. 3C, the entire substrate (the semiconductor substrate and the entire formed film shown in (FIG. 3F) is immersed in a water solution of hydrogen fluoride (HF), hydrogen fluoride is impregnated from sidewalls of the laminated film, and a part of the adjusting film 152 in the inter-electrode is removed by the etching method. In this embodiment, the adjusting film 152 is removed by about 40 nm in the center direction from sidewalls of both the electrodes 14 and 16.

Consequently, the gap 17 is formed in the inter-electrode. In this step, the adjusting film 152 may be removed up to side surfaces of the substrate film 151 to leave the adjusting film 152 only on an upper layer surface of the substrate film 151. An amount of etching can be suitably determined by adjusting the density and the temperature of the chemical and the time of etching.

Eighth Step ST8

As shown in FIG. 3H, an insulating film of $SiO_2$, which becomes the insulating film 18, is formed to cover the entire laminated film by, for example, the plasma CVD method.

The insulating film of $SiO_2$ is not formed in the gap 17 because of coating performance of the plasma CVD method and the gap 17 is maintained.

Ninth Step ST9

As shown in FIG. 3I, the surface of the insulating film 18 is planarized by the chemical mechanical polishing or the like, a part of the insulating film 18 is opened in the center of the second electrode 16, and conductive tungsten (W) is filled in the inside of the insulating film 18.

Tenth Step ST10

Wiring layers and the like shared with not-shown other circuits are formed by a method generally adopted.

For example, when the gap space Tgap is changed to about 7 nm, in fifth step ST5 shown in FIG. 3E, only the thickness of the adjusting film 152 on which the supporting film 15 is formed only has to be adjusted. The gap space Tgap is formed in the thickness of about 7 nm according to the adjustment by the adjusting film 152.

Operation examples of the electronic device 10 are explained below.

Figure 4:
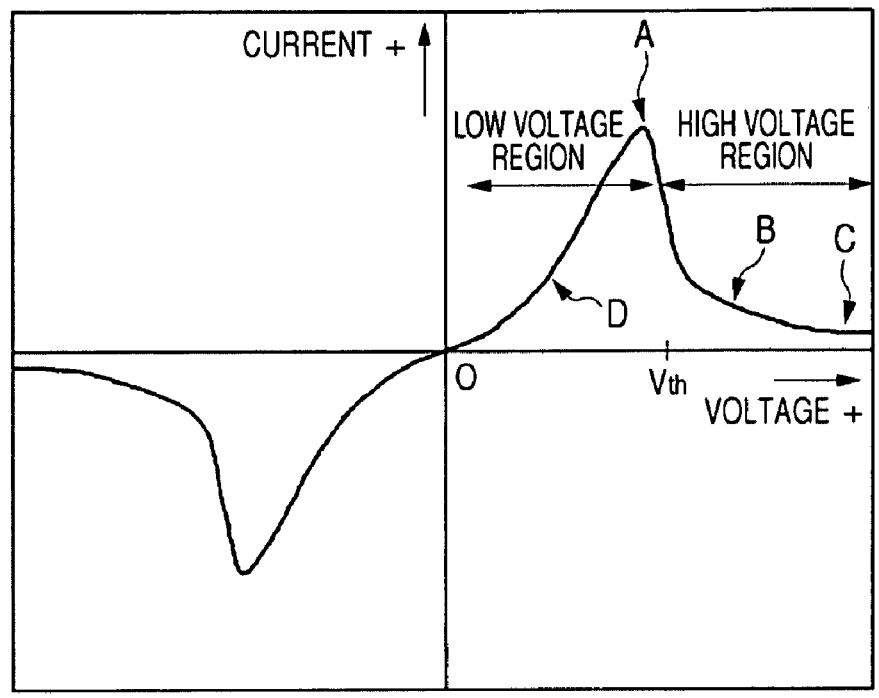
FIG. 4 is a diagram for explaining operation examples of the electronic device according to the first embodiment.
Figure 5:
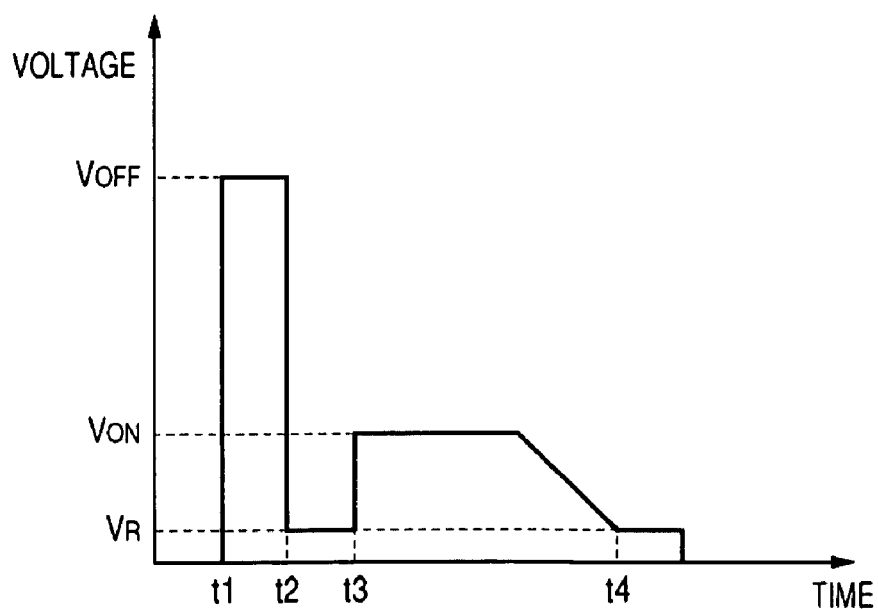
FIG. 5 is a timing chart of the operation examples of the electronic device according to the first embodiment.

FIG. 4 is a diagram for explaining operation examples of the electronic device according to this embodiment. FIG. 5 is a timing chart of the operation examples of the electronic device according to this embodiment.

When voltage is applied between electrodes formed adjacent to each other, a current-voltage characteristic shown in FIG. 4 appears. From threshold voltage $V_{th}$ near an A point to a low voltage region near a 0 point in FIG. 4, a tunnel current flows to the gap 17. A negative resistance effect of increasing resistance appears when applied voltage to the inter-electrode increases (A to C). The tunnel current less easily flows to the gap 17. In this embodiment, the threshold voltage $V_{th}$ is about 3.6 V.

This resistance change is saved even if the applied voltage is rapidly cut off (near the 0 point in FIG. 4). For example, if the voltage in a high voltage region (A to C) is applied to both the electrodes 14 and 16 and the applied voltage is rapidly cut off, a high resistance state, i.e., an OFF state of the electronic device 10 is obtained. Conversely, if the applied voltage is slowly cut off, a low resistance state, i.e., an ON state of the electronic device 10 is obtained. The on and off of the electronic device 10 controls transition time until the applied voltage is cut off.

Such a characteristic is generated because, when the gap space Tgap is near a point where the tunnel current starts to flow, a part of atoms of a metal electrode is reversibly moved by an electric field applied to the inter-electrode or an electric current flowing through the inter-electrode, a gap in the inter-electrode slightly changes by the movement, and the easiness to flow of the tunnel current changes.

The electronic device 10 can be used as a digital switch device if the high resistance state (the OFF state) is set as 0 and the low resistance state (the ON state) is set as 1. Specific operation examples of the electronic device 10 are explained below.

OFF Operation of the Electronic Device 10

As shown in FIG. 5, at time t1, OFF voltage $V_{OFF}$ of a rectangular pulse shape is applied to both the electrodes 14 and 16 such that the voltage is applied to the inter-electrode. In this embodiment, the OFF voltage $V_{OFF}$ is voltage in a high voltage region higher than the threshold voltage $V_{th}$ such as 6 V to 10 V, a pulse width between time t1 and time t2 is suitably set, and build-down time of a pulse is desirably about 1 ns.

Readout Operation

At time t2, readout voltage $V_R$ is applied to both the electrodes 14 and 16 until time t3 such that a potential difference in the inter-electrode becomes a very small voltage. Thereafter, an electric current flowing to the inter-electrode is detected by an ammeter not shown in FIG. 1, FIG. 2, and the like. Since the electronic device 10 is in the high resistance state, an electric current does not flow to the inter-electrode and the OFF state of the electronic device 10 can be detected.

ON Operation of the Electronic Device 10

At time t3, ON voltage $V_{ON}$ of a rectangular pulse shape is applied to both the electrodes 14 and 16 such that the voltage is applied to the inter-electrode. In this embodiment, the ON voltage $V_{ON}$ is threshold voltage $V_{th}$ such as about 3.6 V or voltage slightly higher than the threshold voltage $V_{th}$. A pulse width between time t3 and time t4 is suitably set and is desirably about 100 ns. Thereafter, the voltage is gently lowered to write an ON state.

Readout Operation

At time t4, readout voltage $V_R$ is applied to both the electrodes 14 and 16 until time t5 such that a potential difference in the inter-electrode becomes a very small voltage. Thereafter, the readout operation explained above is performed. Since the electronic device 10 is in the low resistance state, an electric current flows to the inter-electrode and the ON state of the electronic device 10 can be detected.

In order to obtain the ON state, it is desirable to, after applying the ON voltage $V_{ON}$ of a pulse shape to both the electrodes 14 and 16 for at least about 100 ns, gently lower the voltage. The readout voltage $V_R$ is voltage of magnitude enough for detecting an electric current in the inter-electrode.

As explained above in detail, in the electronic device 10, the electrode surfaces of the first electrode 14 and the second electrode 16 are formed to be opposed to each other. The electronic device 10 has the insulative supporting film 15 formed in the multilayer structure that is stacked in a part on the electrode surface of the first electrode 14 and supports the electrode surface of the second electrode and the gap 17 that is formed in a part of the inter-electrode by the supporting film 15 and through which the tunnel current flows. The thickness in the center of both the electrodes 14 and 16 is formed larger than the thickness near the gap 17.

If the thickness of the supporting film 15 is the same as the gap space Tgap of the gap 17, in order to form the fine gap 17, the thickness of the supporting film 15 also has to be reduced to some extent.

In this case, it is likely that the tunnel current flows through the supporting film 15 when high voltage is applied to the inter-electrode or insulation failure of the supporting film 15 is caused in a long term. Therefore, it is necessary to set a limit for the operation voltage of the electronic device 10.

Specifically, when the thickness of the supporting film 15 is about 4 nm, if the voltage of about 2 V is simply applied to the inter-electrode, an electric current of about 0.1 nA/$\mu m^2$ flows through the supporting film 15.

Therefore, in this embodiment, the tunnel current in the supporting film 15 is suppressed and reliability is improved by setting the thickness of the supporting film 15 larger than the gap space Tgap of the fine gap 17.

How voltage is applied to the electronic device 10, i.e., how long the high voltage is applied to the inter-electrode depends on a purpose of use and a circuit configuration and is suitably determined by taking into account reliability of the oxide film (the supporting film 15).

Electronic Device According to a Second Embodiment

An electronic device according to a second embodiment is explained. In this embodiment, only differences from the electronic device according to the first embodiment are explained.

Figure 6:
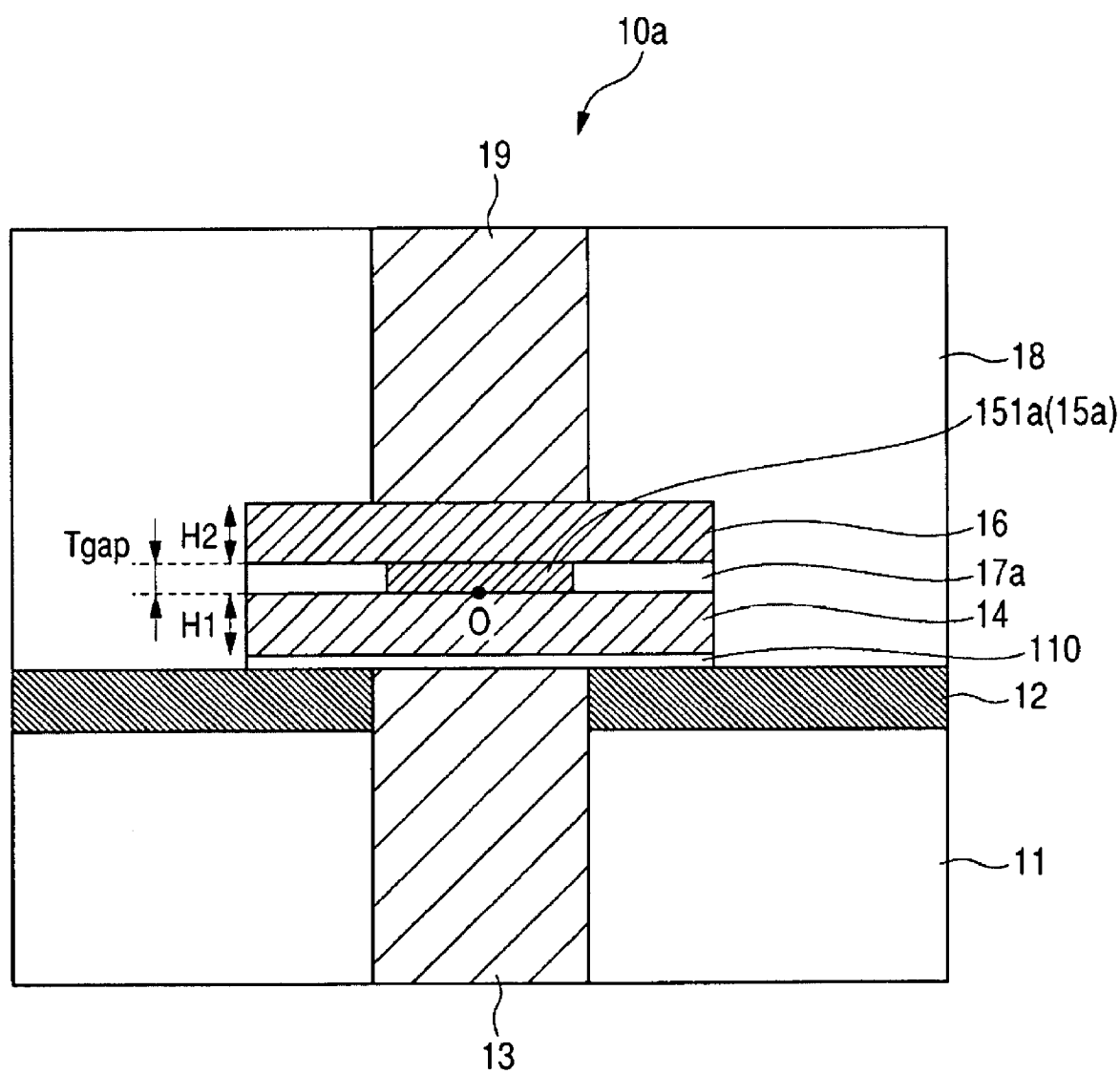
FIG. 6 is a sectional view of an example of a main part of an electronic device according to a second embodiment.

FIG. 6 is a sectional view of an example of a main part of the electronic device according to this embodiment.

In this embodiment, in an electronic device 10a shown in FIG. 6, a supporting film 15a is formed of only a substrate film 151a and the thickness of the supporting film 15 is different from that in the first embodiment. Since the thickness of the supporting film 15a is different, the gap space Tgap is also different from that in the first embodiment.

Specifically, the thickness of the supporting film 15a is slightly thicker than the thickness in which the tunnel current starts to flow, i.e., the thickness that can suppress the tunnel current. The entire supporting film 15a is uniformly formed. Whereas the thickness of the supporting film 15 in the first embodiment is about 10 nm, in this embodiment, the thickness of the supporting film 15a is set to about 7 nm. The thickness is minimum thickness for suppressing a leak current in the supporting film 15a. Therefore, the gap space Tgap is also formed in the thickness of about 7 nm.

A method of manufacturing the electronic device 10a is explained with reference to an example.

Figure 7A:
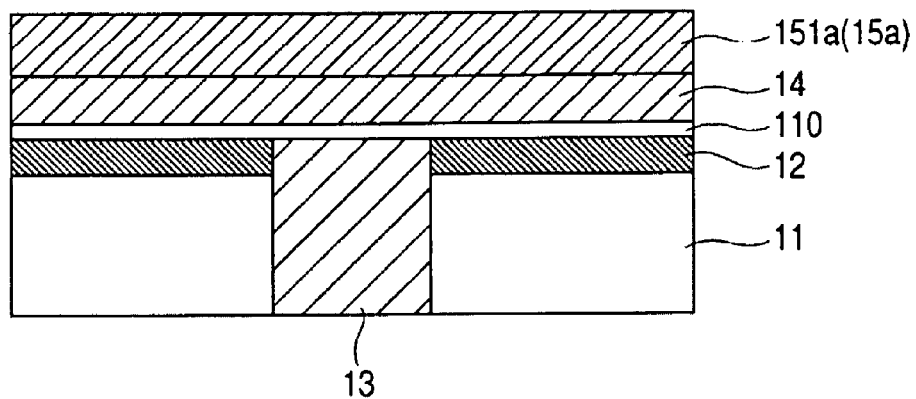
FIGS. 7A to 7C are schematic diagrams for explaining a method of manufacturing the electronic device according to the second embodiment.
Figure 7B:
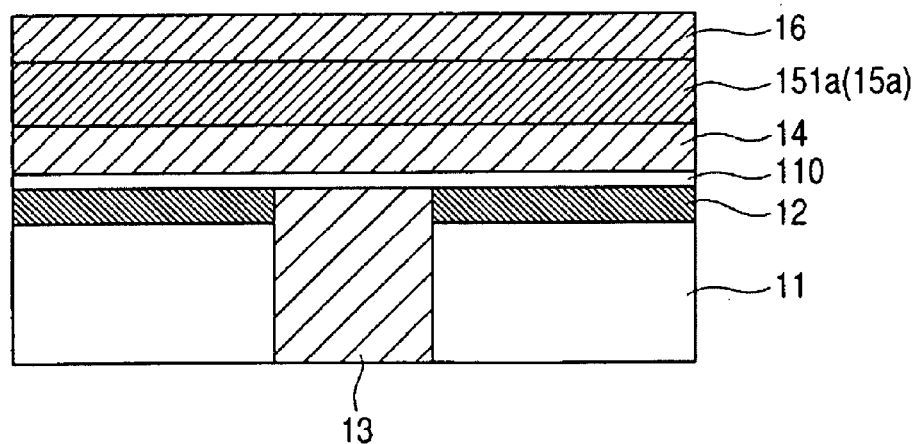
Figure 7C:
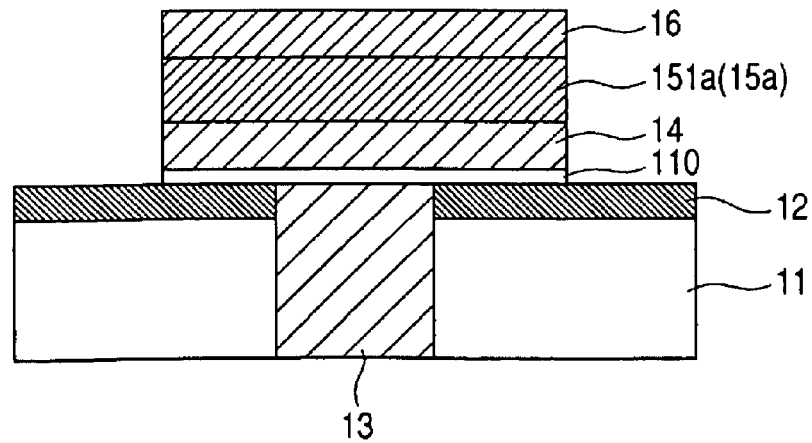

FIGS. 7A to 7C are schematic diagrams for explaining a method of manufacturing an electronic device according to this embodiment. FIGS. 7A to 7C are sectional views taken along a broken line A-B shown in FIG. 2.

After steps same as steps ST1 to ST3 shown in FIGS. 3A to 3C, as shown in FIG. 7A, an insulating film of $SiO_2$, which becomes the substrate film 151a, is formed in the thickness of about 7 nm on the first electrode 14 by the chemical vapor deposition method.

Subsequently, as shown in FIG. 7B, a film (a layer) of gold, which becomes the second electrode 16, is formed in the thickness of about 30 nm on the substrate film 151a by one of the sputtering method and the chemical vapor deposition method.

As shown in FIG. 7C, a laminated film formed by the base layer 110, the first electrode 14, the substrate film 151a, and the second electrode 16 is etched into a predetermined shape by a method such as the photolithography method or the etching method. In this embodiment, the laminated film is etched into a circular shape with a diameter of about 150 nm (the electrode radius R=75 nm) shown in FIG. 2.

Steps after that are the same as steps ST7 to ST9 and ST10 shown in FIGS. 3G to 3I.

In this embodiment, the tunnel current may less easily flow because the gap space Tgap is too wide. In this case, at a stage of initialization before the electronic device 10a is actually used, ON writing voltage is applied to the inter-electrode for long time (about several milliseconds). Consequently, the tunnel current increases, atoms on the electrode surfaces move, and the gap space Tgap decreases. As a result, it is possible to practically use the electronic device 10a.

As another manufacturing method, after the step shown in FIG. 7C, plating of gold is selectively performed in a state in which the gap space Tgap is formed. Specifically, gold plating with the thickness of about 1 nm is applied to only exposed portions (the portion of the gap 17a) of both the electrodes 14 and 16. This makes it possible to narrow the gap space Tgap. The gap space Tgap does not always have to be uniform over the entire opposed surfaces of the electrodes. The easiness of the flow of the tunnel current only has to change in the region of the gap 17a. Therefore, strict control is not requested for uniformity of plating of extremely thin gold. The electronic device 10a can be easily manufactured.

In the two embodiments explained above, the first electrode 14 and the second electrode 16 include the circular electrodes. However, the electrodes may be rectangular, square, or other shapes. The electrodes 14 and 16 including rectangular electrodes are explained with reference to the electronic device according to the first embodiment as an example.

Figure 8:
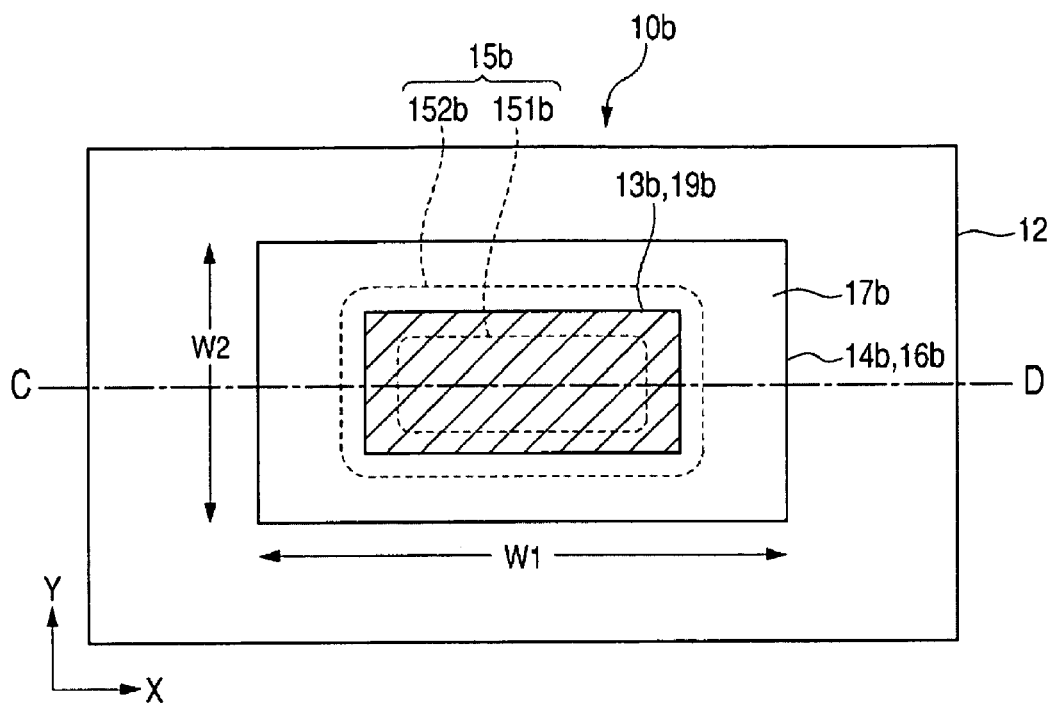
FIG. 8 is a plan view for explaining an electronic device in which first and second electrodes have rectangular electrodes according to an embodiment.

FIG. 8 is a plan view of an electronic device for explaining the first and second electrodes of the electronic device according to the embodiments including rectangular electrodes. A sectional view taken along a broken line C-D shown in FIG. 8 is FIG. 1. In FIG. 8, a part of the electronic device such as an insulating film is not shown.

As shown in FIG. 8, an electrode device 10b includes a first electrode 14b and a second electrode 16b having width W1 in an X axis direction and width W2 in a Y axis direction. A first contact hole 13b, a second contact hole 19b, a supporting film 15b (a substrate film 151b and an adjusting film 152b), and a gap 17b are formed in a rectangular shape according to a shape of both the electrodes 14b and 16b. In this case, for example, in the sixth step ST6, the laminated film only has to be etched into the shape shown in FIG. 8.

Storage Device According to the First Embodiment

A storage device according to the first embodiment employing the electronic device according to the first embodiment is explained. In the storage device according to this embodiment, the electronic device according to the first embodiment is adopted. However, the electronic device according to the second embodiment may be adopted.

Figure 9:
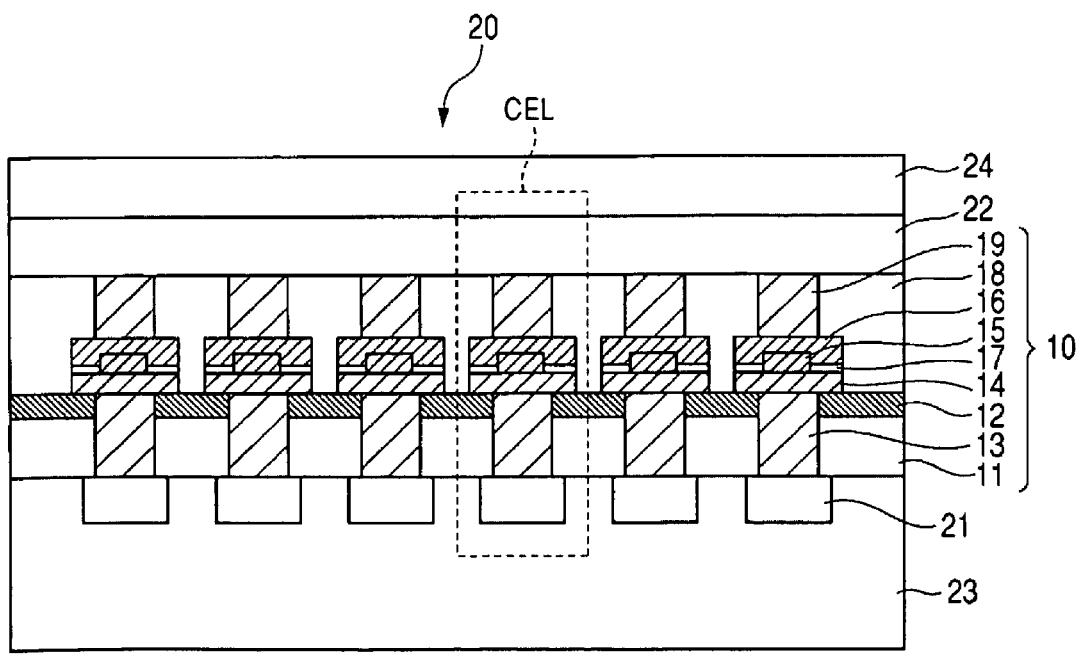
FIG. 9 is a sectional view of an example of a storage device according to the first embodiment.
Figure 10:
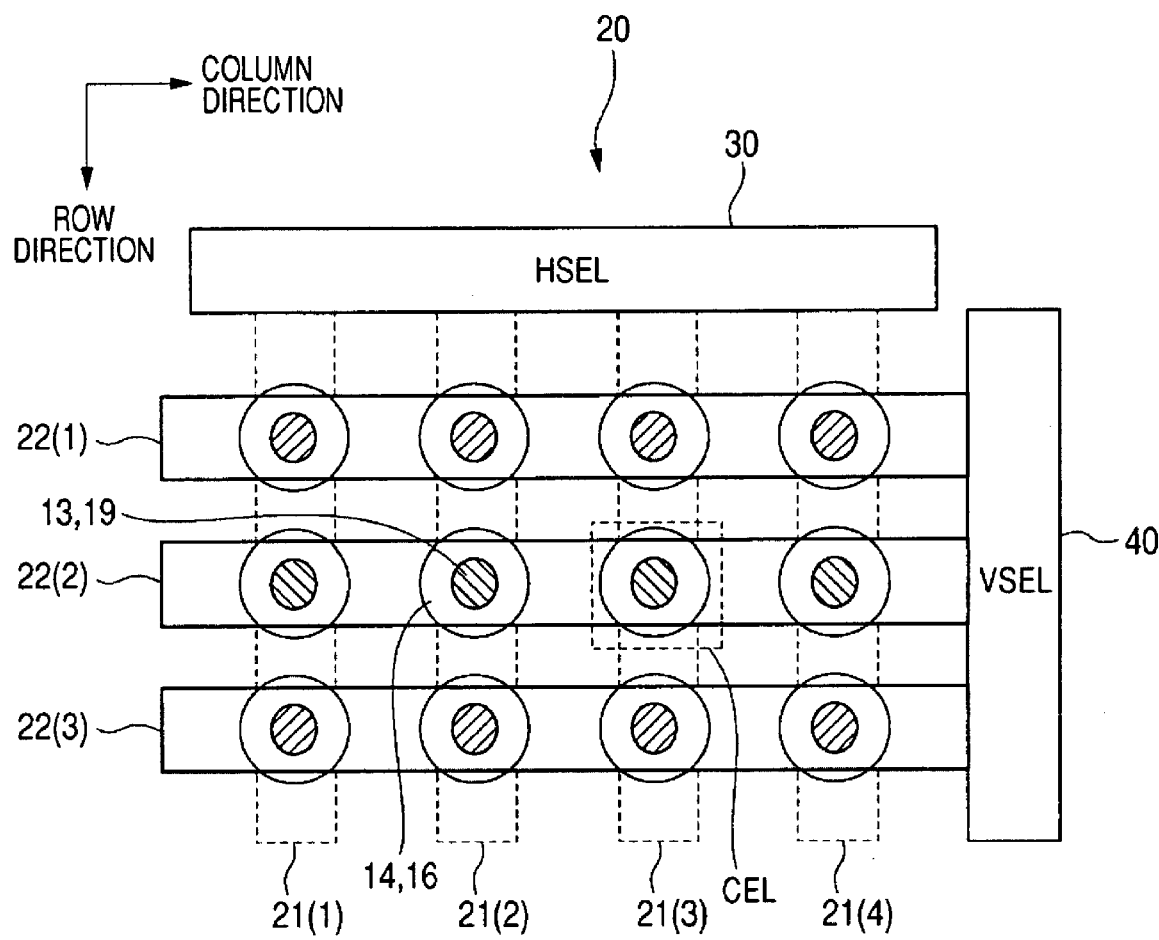
FIG. 10 is a plan view of the storage device shown in FIG. 9.

FIG. 9 is a sectional view of an example of the storage device according to this embodiment. FIG. 10 is a plan view of the storage device shown in FIG. 9. In FIGS. 9 and 10, a part of the storage device such as an insulating film and a base layer is not shown.

As shown in FIG. 9, a storage device 20 includes electronic devices 10, lower wiring layers (first wiring layers) 21, upper wiring layers (second wiring layers) 22, and insulating layers 23 and 24. Cells CEL are formed by the components.

As shown in FIG. 10, the storage device 20 includes a column selection circuit (HSEL) 30 as a first voltage supplying circuit and a row selection circuit (VSEL) 40 as a second voltage supplying circuit.

The cells CEL are arrayed in a matrix shape as shown in FIG. 10. In the figure, for simplification of explanation, it is assumed that twelve cells CEL in total, three cells CEL in a row direction and four cells CEL in a column direction, are arrayed. In the following explanation, a cell in an ith (=1, 2, . . . ) row and a jth (j=1, 2, . . . ) column is described in such a manner as CLE(i, j) as appropriate. The lower wiring layers 21 and the upper wiring layers 22 explained later are also described in such a manner as lower wiring layers 21(j) and upper wiring layers 22(i) as appropriate.

Cells CEL in the same row (e.g., cells CEL(1, j)) are connected in common to the upper wiring layers 22 (e.g., an upper wiring layers 22(1)) connected to second electrodes 16 in the cells CEL via second contact holes 19.

Cells CEL in the same column (e.g., cells (i, 1)) are connected in common to the lower wiring layers 21 (e.g., the lower wiring layers 21(1)) connected to first electrodes 14 in the cells CEL via first contact holes 13.

As shown in FIG. 9, the lower wiring layers 21 are connected to the first electrodes 14 of the electronic devices 10 via first contact holes 13. The lower wiring layers 21 other than connecting portions to the first contact holes 13 are covered with the insulating layers 23 or the interlayer insulating film 11. The lower wiring layers 21 are formed of aluminum (Al). However, a material of the lower wiring layers 21 is not specifically limited as long as the material is a conductor.

As shown in FIG. 10, the lower wiring layers 21 in the same column (e.g., the lower wiring layers 21(1)) are connected in common to the first electrodes 14 in the cells CEL in the same column (e.g., the cells CEL(i, 1)) via the first contact holes 13. One ends of the lower wiring layers 21 are connected to the column selection circuit 30.

As shown in FIG. 9, the upper wiring layers 22 are connected to the second electrodes 16 of the electronic device 10 via the second contact holes 19. The upper wiring layers 22 other than connecting portions to the second contact holes 19 are covered with the insulating layer 24 or the insulating film 18. The upper wiring layers 22 are formed of aluminum (Al). However, a material of the upper wiring layers 22 is not specifically limited as long as the material is a conductor.

As shown in FIG. 10, the upper wiring layers 22 in the same row (e.g., the upper wiring layers 22(1)) are connected in common to the second electrodes 16 in the cells CEL in the same row (e.g., the cells CEL(1, j)) via the second contact holes 19. One ends of the upper wiring layers 22 are connected to the row selection circuit 40.

As shown in FIG. 9, the insulating layer 23 is formed of insulative $SiO_2$ to cover the lower wiring layers 21.

As shown in FIG. 9, the insulating layer 24 is formed of insulative $SiO_2$ to cover the upper wiring layers 22.

The lower wiring layers 21 in the column direction are connected to the column selection circuit 30. The column selection circuit 30 applies predetermined voltage (first voltage) to the lower wiring layers 21 in the rows to which the cells CEL set as targets (to which writing or erasing is applied) are connected. Specifically, the column selection circuit 30 applies writing voltage $V_{HW}$ to the lower wiring layers 21 when writing is applied to the electronic devices 10 set as targets, applies readout voltage $V_{HR}$ to the lower wiring layers 21 when states of the devices are read out, and applies erasing voltage $V_{HD}$ to the lower wiring layers 21 when the states of the devices are erased. The column selection circuit 30 applies, for the electronic devices 10 other than the targets, voltage $V_{HL}$ to the lower wiring layers 21. Details of the application of the voltage are explained later.

The upper wiring layers 22 in the row direction are connected to the row selection circuit 40. The row selection circuit 40 applies predetermined voltage (second voltage) to the upper wiring layers 22 in the rows to which the cells CEL set as targets are connected. Specifically, the row selection circuit 40 applies writing voltage $V_{VW}$ to the upper wiring layers 22 when writing is applied to the electronic devices 10 set as targets, applies readout voltage $V_{VR}$ to the upper wiring layers 22 when states of the devices are read out, and applies erasing voltage $V_{VD}$ to the upper wiring layers 22 when the states of the devices are erased. The row selection circuit 40 applies, for the electronic devices 10 other than the targets, voltage $V_{VL}$ to the upper wiring layers 22. Details of the application of the voltage are explained later.

An example of operations of the storage device 20 is explained below with reference to FIG. 11.

Figure 11:
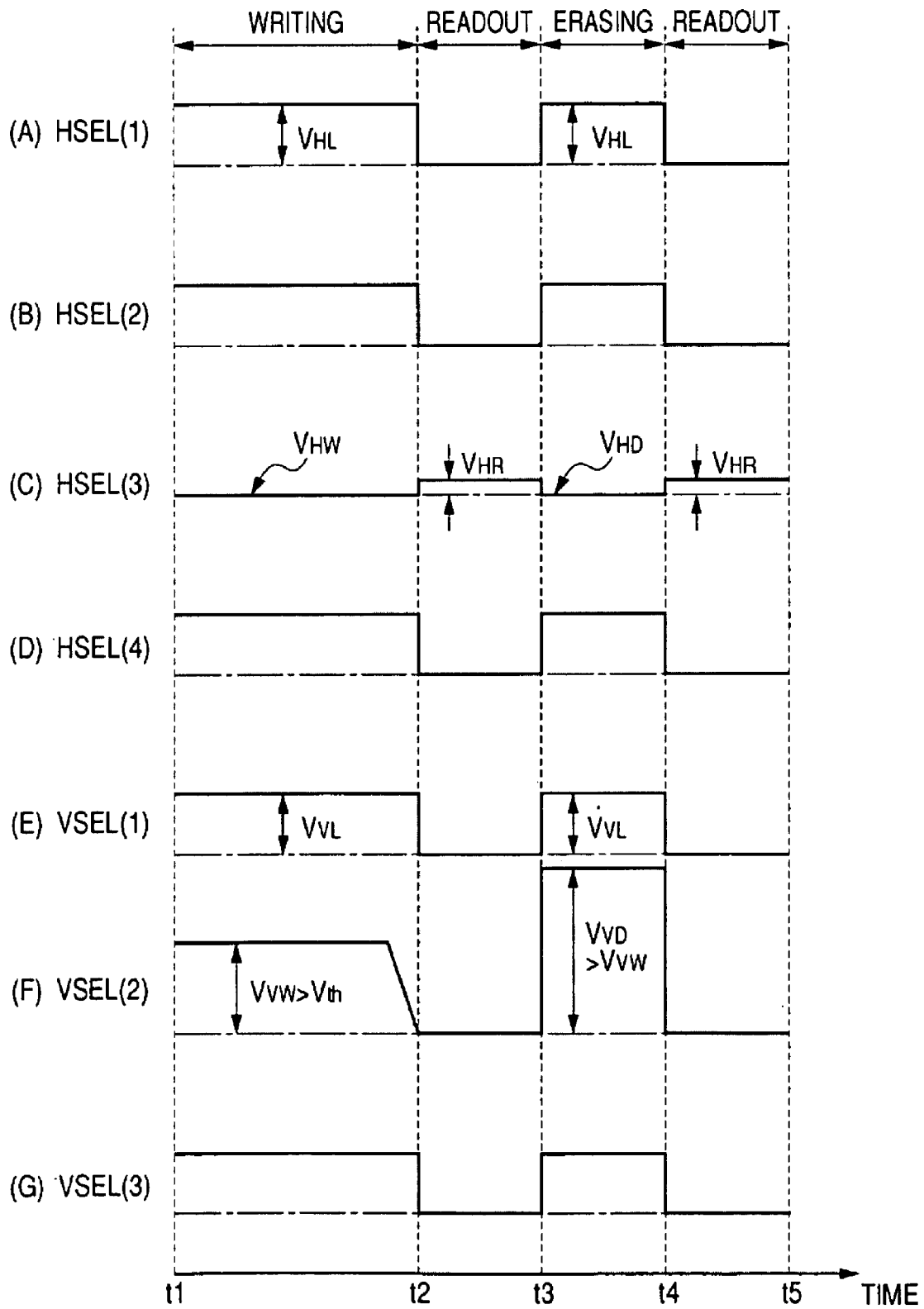
FIG. 11 is a timing chart of the storage device according to the first embodiment.

FIG. 11 is a timing chart of the storage device according to this embodiment. In FIG. 11, HSEL(i) indicates voltage outputted by the column selection circuit 30 and VSEL(j) indicates voltage outputted by the row selection circuit 40.

In this embodiment, for simplification of explanation, it is assumed that writing and erasing (of voltage) are applied to a cell CEL(3, 2) and states of all the cells CEL are read out from the cells CEL. Before time t1 in FIG. 11, it is assumed that the electronic devices 10 are in the OFF state.

Writing Operation

At time t1, the column selection circuit 30 applies the writing voltage $V_{HW}$ to the lower wiring layer 21(3) ((C) of FIG. 11), applies the voltage $V_{HL}$ to the other lower wiring layers 21 ((A), (B), (D) of FIG. 11), and holds the voltages until time t2. In this embodiment, the writing voltage $V_{HW}$ is about the ground voltage (0 V) and the voltage $V_{HL}$ is about 3 V.

At the same time t1, the row selection circuit 40 applies the writing voltage $V_{VW}$ to the upper wiring layers 22(2) ((F) of FIG. 11), applies the voltage $V_{VL}$ to the other upper wiring layers 22 ((E) and (G) of FIG. 11), and holds the voltages until time t2. In this embodiment, the writing voltage $V_{VW}$ is about 4 V higher than threshold voltage $V_{th}$ (=about 3.6 V) and the voltage $V_{VL}$ is about 3 V. Writing time between time t1 and time t2 is suitably set. However, it is desirable that the writing time is at least equal to or longer than 100 ns and voltage build-down time is equal to or longer than about 50 ns.

Consequently, voltage (a potential difference) of 4 V is applied to the inter-electrode (of both the electrodes 14 and 16 opposed to each other) of the cell CEL(3, 2). The voltage of about 0V, 1V, or 3V is applied to inter-electrodes of the other cells CEL. For example, the voltage of about 0 V is applied to inter-electrode of a cell CEL(1, 1) and the voltage of about 1 V is applied to inter-electrode of a cell CEL(3, 3).

In other words, only the electronic device 10 of the cell CEL(3, 2), in which voltage near the threshold voltage $V_{th}$ (near a B point in FIG. 4) is applied to the inter-electrode for predetermined time (about 100 ns), is switched to the ON state. The electronic devices 10 of the other cells are kept in the OFF state.

Readout Operation

At time t2, the column selection circuit 30 applies the readout voltage $V_{HR}$ to the lower wiring layers 21 in one column and applies 0 V to the other lower wiring layers 21 until time t3. The row selection circuit 40 applies 0 V to the upper wiring layers 22 in all the rows until time t3. Electric currents flowing to the upper wiring layers 22 corresponding to the respective rows are electric currents corresponding to ON and OFF of the respective cells CEL connected to the lower wiring layers 21 selected by the column selection circuit 30.

Therefore, as shown in FIG. 11, when the column selection circuit 30 selects the lower wiring layer 21(3), an electric current flows to inter-electrodes of the respective cells CEL connected to the lower wiring layers 21(3). This electric current is read out from the respective cells CEL by an ammeter not shown in FIGS. 9 and 10. At this point, electric currents corresponding to written voltages are detected from the respective cells CEL. It is possible to detect whether the resistances of the respective electronic devices 10 are in a high state or a low state.

At this point, since only the cell CEL(3, 2) is written in the ON state, only an electric current flowing to the upper wiring layers 22(2) increases.

In other words, a low resistance state is detected from only the electronic device 10 of the cell CEL(3, 2) and it is possible to detect that the electronic device 10 is in the ON state.

In the same manner, the column selection circuit 30 sequentially selects the other lower wiring layers 21. Electric currents flowing to the respective upper wiring layers 22 at that point are read out to detect states of all the cells CEL.

Erasing Operation

At time t3, the column selection circuit 30 applies the erasing voltage $V_{HD}$ to the lower wiring layer 21(3) ((C) of FIG. 11), applies the voltage $V_{HL}$ to the other lower wiring layers 21 ((A), (B), and (D) of FIG. 11), and holds the voltages until time t4. In this embodiment, the erasing voltage $V_{HD}$ is about the ground voltage (0 V).

At the same time t3, the row selection circuit 40 applies the erasing voltage $V_{VD}$ to the upper wiring layers 22(2) ((F) of FIG. 11), applies the voltage $V_{VL}$ to the other upper wiring layers 22 ((E) and (G) of FIG. 11), and holds the voltages until time t4.

In this embodiment, the erasing voltage $V_{VD}$ is voltage higher than the writing voltage $V_{VW}$ (e.g., voltage near a C point in FIG. 4, about 6 V). Erasing time between time t3 and time t4 is suitably set. However, about 1 ns is desirable.

Consequently, the erasing voltage $V_{HD}$ is applied to only the inter-electrode of the cell CEL(3, 2) and the voltage of about 0 V or 3 V is applied to the inter-electrodes of the other cells CEL. For example, the voltage of about 0 V is applied to the inter-electrode of the cell CEL(1, 1) and the voltage of about 3 V is applied to the inter-electrode of the cell CEL(3, 3).

In other words, only the electronic device 10 of the cell CEL(3, 2), in which voltage higher than the threshold voltage $V_{th}$ (near a C point in FIG. 4) is applied to the inter-electrode and, thereafter, the voltage is steeply cut off, is switched to the OFF state. The electronic devices 10 of the other cells are kept in the OFF state.

Readout Operation

A readout operation from time t4 to time t5 is performed in a procedure same as that explained above.

Consequently, a high resistance state is detected from all the cells CEL and it is possible to detect that the cells CEL are in the OFF state.

As explained above, voltage only has to be applied between both the electrodes 14 and 16 such that voltage for causing a resistance change in the electronic devices 10 is applied to inter-electrode of the cell CEL to which voltage is applied (voltage near the threshold voltage $V_{th}$ is applied for a long period during writing and voltage higher than the threshold voltage $V_{th}$ is applied for a short period during erasing). Voltage only has to be applied between both the electrodes 14 and 16 such that voltage equal to or lower than about the threshold voltage $V_{th}$ is applied to the inter-electrodes of the cells CEL other than the target.

As explained above, this embodiment is a basic configuration of the storage device employing the electronic device 10.

Storage Device According to the Second Embodiment

A storage device employing the electronic device according to the second embodiment is explained. In this embodiment, differences from the storage device according to the first embodiment are mainly explained.

Figure 12:
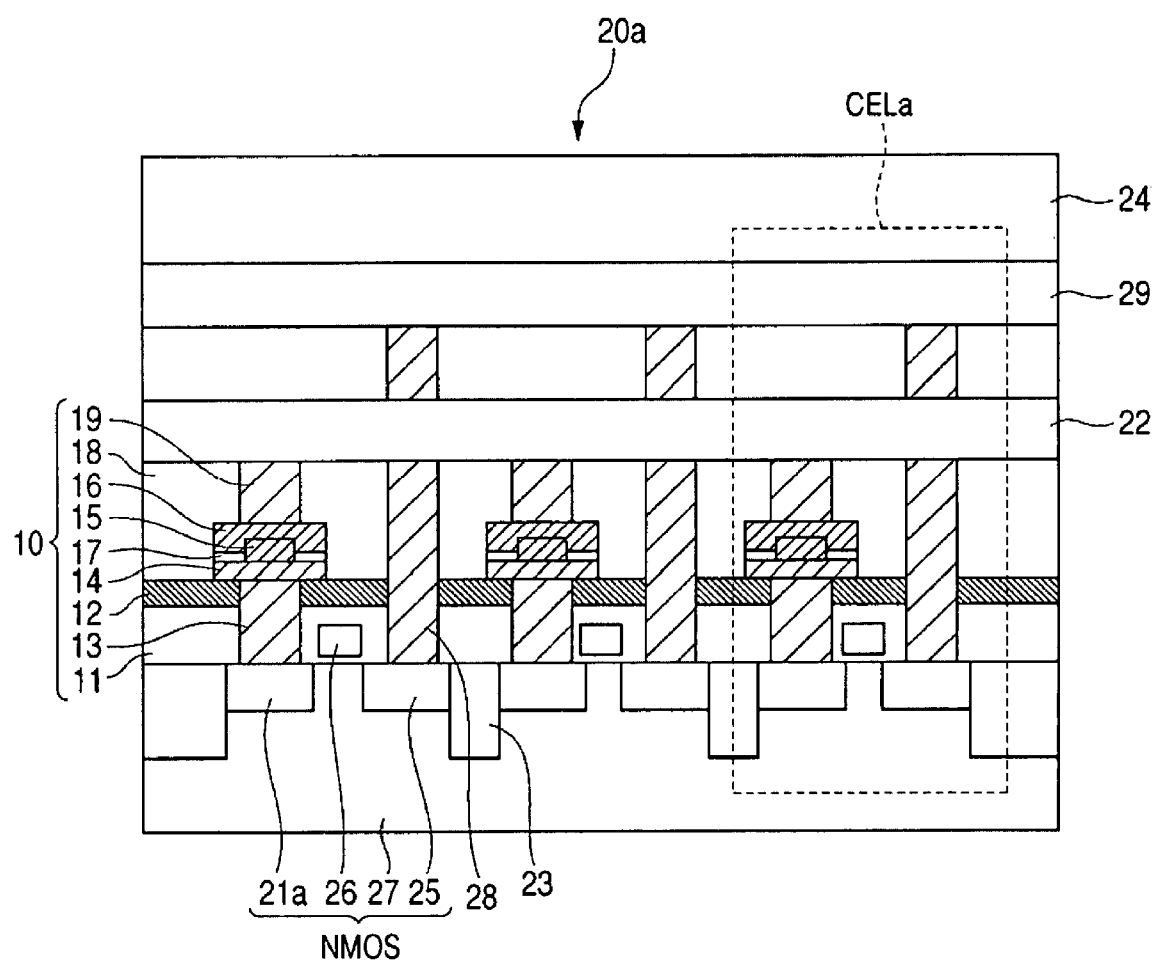
FIG. 12 is a sectional view of an example of a storage device according to the second embodiment.
Figure 13:
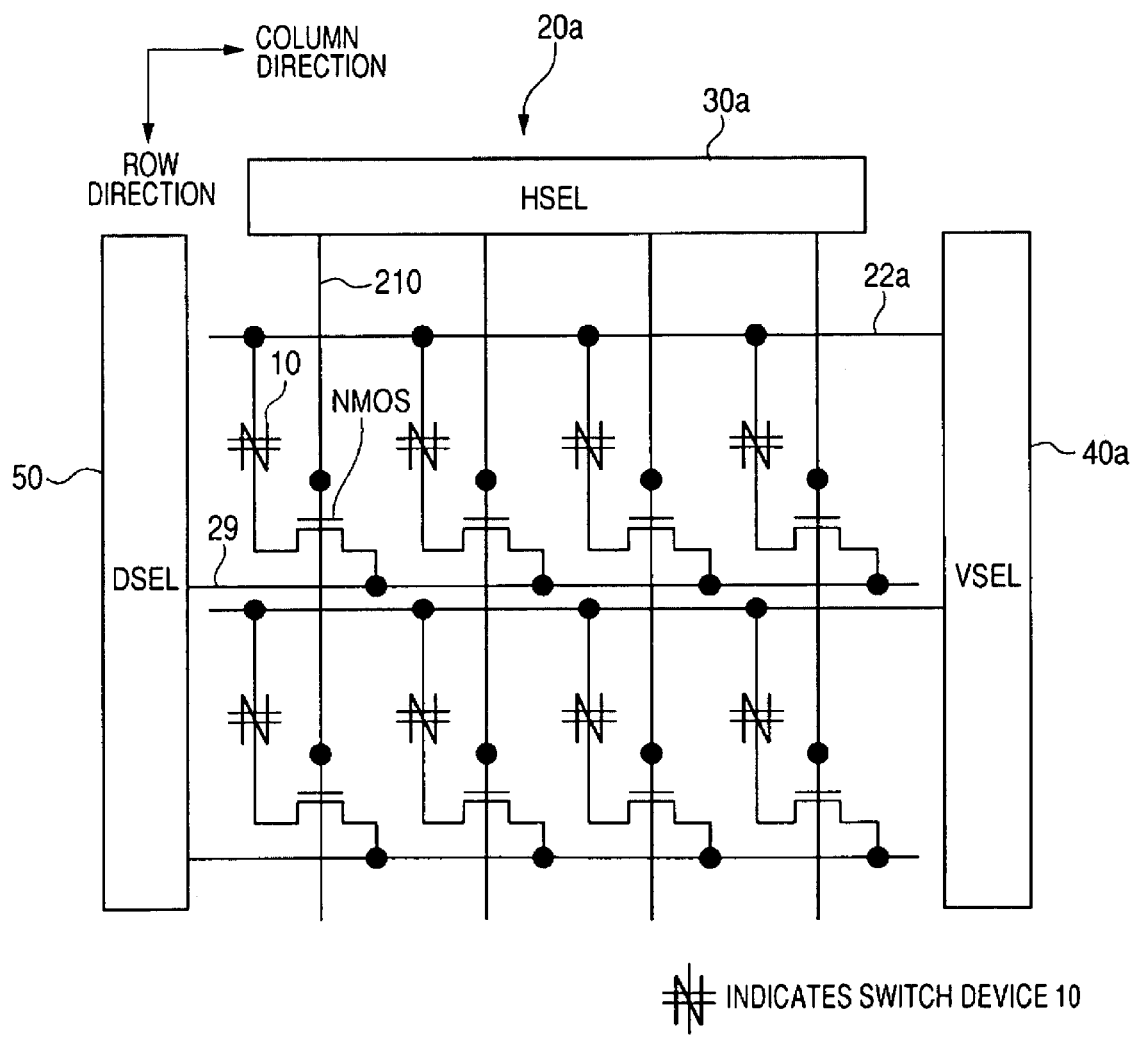
FIG. 13 is an equivalent circuit diagram of the storage device shown in FIG. 12.

FIG. 12 is a sectional view of an example of the storage device according to this embodiment. FIG. 13 is an equivalent circuit diagram of the storage device shown in FIG. 12. In FIG. 12, a part of the storage device such as a base layer is not shown.

As shown in FIG. 12, a storage device 20a includes electronic devices 10, n-type source layers 21a, first upper wiring layers 22a (first wiring layers), insulating layers 23 and 24, n-type drain layers 25, gate electrodes 26, a p-type semiconductor substrate 27, third contact holes 28, second upper wiring layers (second wiring layers) 29, and gate wiring layers (third wiring layers) 210 (not shown).

n-channel MOSFETs (Metal Oxide Semiconductor Field Effect Transistors: hereinafter referred to as NMOSs) as transistors are formed by the source layers 21a, the drain layers 25, the gate electrodes 26, and the semiconductor substrate 27. Cells CELa are formed by the components.

As shown in FIG. 13, the storage device 20a includes the gate wiring layers 210, a column selection circuit (HSEL) 30a as a first voltage circuit, a row selection circuit (VSEL) 40a, and a data selection and detection circuit (DSEL) 50.

In this embodiment, the first electrodes 14 are connected to the source layers 21a via the first contact holes 13. As shown in FIG. 13, the first electrodes 14 of the electronic devices 10 are connected to sources of the NMOSs. The column selection circuit 30a and the row selection circuit 40a select the cell CELa to which voltage is applied. Components different from those in the first embodiment are explained.

As shown in FIG. 13, the cells CELa are arrayed in a matrix shape. In the figure, for simplification of explanation, it is assumed that eight cells CELa in total, two cells CELa in the row direction and four cells CELa in the column direction, are arrayed.

The first upper wiring layers 22a (e.g., a first upper wiring layers 22a(1)) in the cells CELa are connected in common to the cells CELa in the same row (e.g., cells CELa(1, j)). The second upper wiring layers 29 (e.g., the second upper wiring layers 29(1)) are connected in common to the cells CELa.

In the cells CELa (e.g., cells CELa(i, 1)) in the same column, the gate electrodes 26 in the cells CELa are connected in common to the gate wiring layers 210 (e.g., gate wiring layers (1)).

The source layers 21a are n-type silicon regions formed on the p-type semiconductor substrate 27 and are connected to the first electrodes 14 via the first contact holes 13. A part on the semiconductor substrate 27 side of the source layers 21a is insulated from the drain layers 25 of the cells CELa adjacent thereto by the insulating layers 23. A part on the electronic devices 10 side of the source layers 21a is covered with the interlayer insulating film 11.

The drain layers 25 are n-type silicon regions formed on the p-type semiconductor substrate 27 and are connected to the second upper wiring layers 29 via the third contact holes 28. A part on the semiconductor substrate 27 side of the drain layers 25 is insulated from the source layers 21a of the cells CELa adjacent thereto by the insulating layers 23. A part on the electronic devices 10 side of the drain layers 25 is covered with the interlayer insulating film 11.

Portions around the gate electrodes 26 are covered with the interlayer insulating film 11. As shown in FIG. 13, the gate electrodes 26 are connected to the column selection circuit 30a as the gate wiring layers 210.

The portion of the semiconductor substrate 27 is a p-well formed of p-type silicon. The source layers 21a and the drain layers 25 are formed in an upper layer of the semiconductor substrate 27. The insulating layers 23 are formed to insulate the source layers 21a and the drain layers 25 adjacent to each other.

The third contact holes 28 are opened in parts of the interlayer insulating film 11, the etching preventing film 12, and the insulating film 18, so as to connect the drain layers 25 and the second upper wiring layers 29. For example, conductive tungsten is filled in the inside of the contact holes 28.

The second upper wiring layers 29 are connected to the drain layers 25 of the NMOSs via the third contact holes 28. The second upper wiring layers 29 other than the connecting portions to the third contact holes 28 are covered with the insulating layer 24. The second upper wiring layers 29 are formed of aluminum. However, a material of the second upper wiring layers 29 is not specifically limited as long as the material is a conductor.

As shown in FIG. 12, the second upper wiring layers 29 in the same row (e.g., the second upper wiring layers 29(1)) are connected in common to the drain layers 25 in the cells CELa in the same row (e.g., the cells CELa(1, j)) via the third contact holes 28. As shown in FIG. 13, one ends of the second upper wiring layers 29 are connected to the data selection and detection circuit 50.

As shown in FIG. 13, the gate wiring layers 210 in the same column (e.g., the gate wiring layers 210(1)) are connected in common to the gate electrodes 26 in the cells CELa in the same column (e.g., the cells CELa(1, j)). One ends of the gate wiring layers 210 are connected to the column selection circuit 30a.

As shown in FIG. 13, sources, drains, and gates of the NMOSs are connected to the first electrodes 14 of the electronic devices 10, the data selection and detection circuit 50, and the column selection circuit 30a, respectively. When predetermined voltage is applied to the second upper wiring layers 29, i.e., the drain layers 25 and voltage is applied to the gate electrodes 26 in a state in which the electronic devices 10 are on (the tunnel current flows between both the electrodes 14 and 16), an electric current flows from the electronic devices 10 to the drain layers 25 via the source layers 21a.

The gate wiring layers 210 in the column direction are connected to the column selection circuit 30a. The column selection circuit 30a applies voltage for tuning on the NMOSs to the gate wiring layer 210 in a column to which the cell CELa to which voltage is applied is connected.

The first upper wiring layers 22a in the row direction are connected to the row selection circuit 40a. The row selection circuit 40a applies predetermined voltage (any one of the writing voltage $V_{VW}$, the readout voltage $V_{VR}$, the erasing voltage $V_{VD}$, and the voltage $V_{VL}$) to the first upper wiring layers 22a in the row to which the cell CELa to which voltage is applied is connected.

The second upper wiring layers 29 in the row direction are connected to the data selection and detection circuit 50. The data selection and detection circuit 50 is connected to a circuit (not shown) that detects an electric circuit flowing to the cell CELa to which voltage is applied. Potential applied to the second upper wiring layers 29 by the data selection and detection circuit 50 is basically 0 V.

Figure 14:
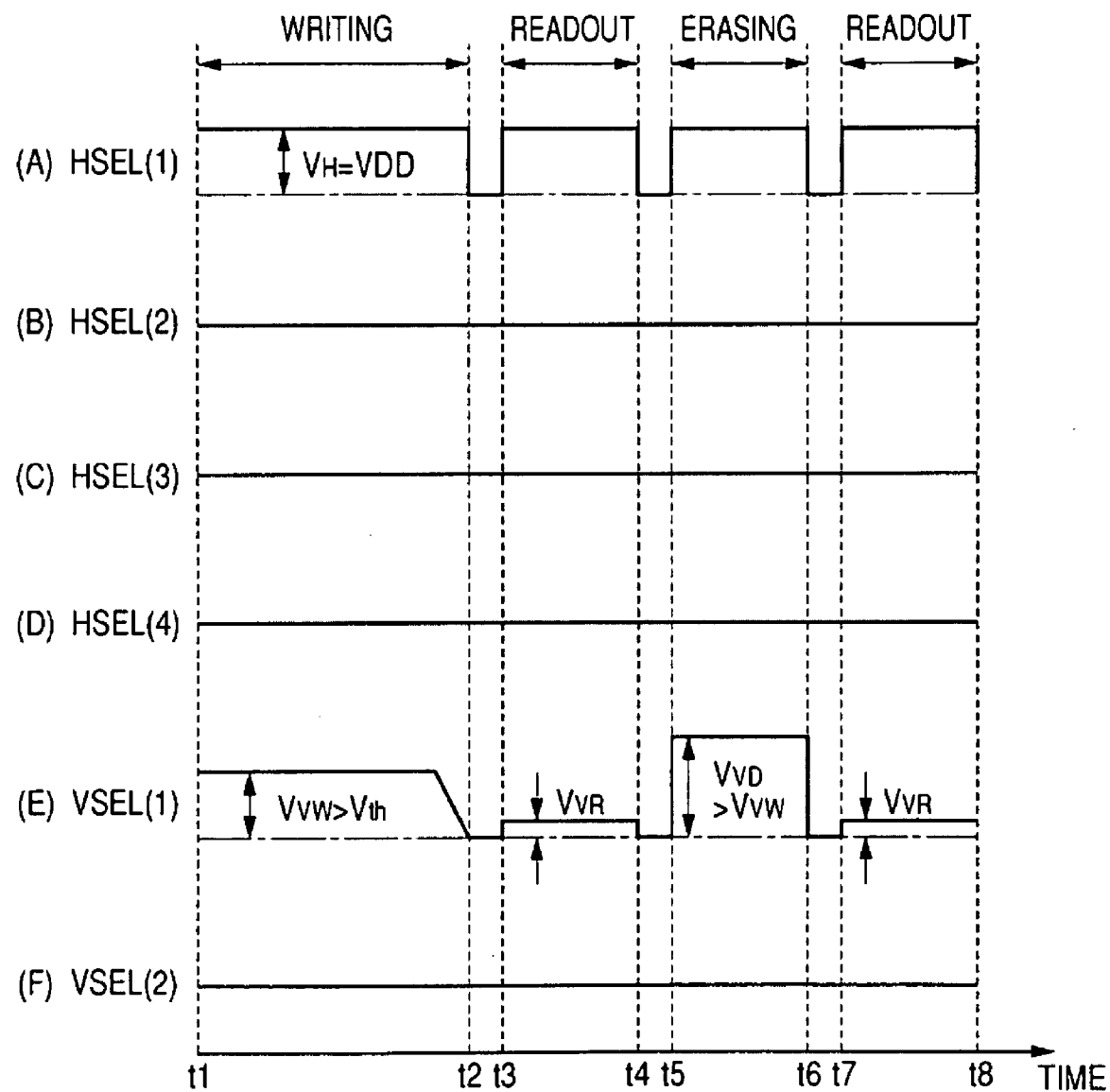
FIG. 14 is a timing chart of the storage device according to the second embodiment.

An example of operations of the storage device 20a is explained below. FIG. 14 is a timing chart of the storage device according to this embodiment. In FIG. 14, HSEL(i) indicates voltage outputted by the column selection circuit 30a and VSEL(j) indicates voltage outputted by the row selection circuit 40a. In this embodiment, for simplification of explanation, it is assumed that writing, readout, and erasing are applied to the cell CELa(1, 1).

Writing Operation

At time t1, the column selection circuit 30a applies voltage $V_H$ to the gate wiring layers 210(1) as a selection signal ((A) of FIG. 14). Since the other gate wiring layers 210 are unselected, the column selection circuit 30a applies the voltage of 0 V to the other gate wiring layers 210 ((B) to (D) of FIG. 14). The column selection circuit 30a holds the voltages until time t2.

At the same time t1, the row selection circuit 40a applies the writing voltage $V_{VW}$ to the first upper wiring layers 22a(1) ((E) of FIG. 14), applies the voltage of 0 V to the other first upper wiring layers 22a ((F) of FIG. 14), and holds the voltages until time t2. In this embodiment, the voltage $V_H$ is power supply voltage VDD and the writing voltage $V_{VW}$ is about 4 V higher than the threshold voltage $V_{th}$ (=about 3.6 V). Thereafter, the column selection circuit 30a gently lowers the writing voltage $V_{VW}$.

At the same time t1, the data selection and detection circuit 50 applies the voltage of 0 V to all the second upper wiring layers 29 and holds the voltage over all the times (t1 to t8) (not shown).

In this embodiment, short standby periods are provided among respective cycles of the writing operation, the readout operation, and the erasing operation (t2 to t3, t4 to t5, and t6 to t7).

Readout Operation

At time t3, the column selection circuit 30a applies the voltage $V_H$ to the gate wiring layers 210(1) ((A) of FIG. 14) and applies the voltage of 0 V to the other gate wiring layers 210 until time t4 ((B) to (D) of FIG. 14).

At the same time t3, the row selection circuit 40a applies the readout voltage $V_{VR}$ to the first upper wiring layers 22a(1) and applies the voltage of 0 V to the other first upper wiring layers 22a until time t4 ((E) and (F) of FIG. 14).

In this embodiment, the readout voltage $V_{VR}$ is potential (about 1 V) sufficiently lower than the threshold voltage $V_{th}$ for a state change with which the resistance of the electronic devices 10 can be measured.

At this point, the data selection and detection circuit 50 reads out, from the second upper wiring layers 29(1), an electric current flowing to the cell CEL(1, 1) and detects the electric current in a not-shown circuit.

Similarly, the column selection circuit 30a sequentially selects the other gate wiring layers 210 and the row selection circuit 40a sequentially selects the other first upper wiring layers 22a. The column selection circuit 30a and the row selection circuit 40a read out electric currents flowing to the second upper wiring layers 29 to detect states of all the cells CEL.

Erasing Operation

At time t5, the column selection circuit 30a applies the voltage $V_H$ to the gate wiring layers 210(1) ((A) of FIG. 14), applies the voltage of 0 V to the other gate wiring layers 210 ((B) to (D) of FIG. 14), and holds the voltages until time t6.

At the same time t5, the row selection circuit 40a applies the erasing voltage $V_{VD}$ to the first upper wiring layers 22a(1) ((E) of FIG. 14), applies the voltage of 0 V to the other first upper wiring layers 22 ((F) of FIG. 14), and holds the voltages until time t6. Thereafter, the row selection circuit 40a steeply cuts off the erasing voltage $V_{VD}$.

In this embodiment, the erasing voltage $V_{VD}$ is voltage higher than the writing voltage $V_{VW}$.

In this embodiment, it is unnecessary to limit voltage applied to the first and second upper wiring layers to limit the influence on unselected cells. Therefore, a degree of freedom in a circuit configuration and operations can be improved.

Storage Device According to a Third Embodiment

A storage device employing an electronic device according to a third embodiment is explained. In this embodiment, differences from the storage device according to the first embodiment are mainly explained.

Figure 15:
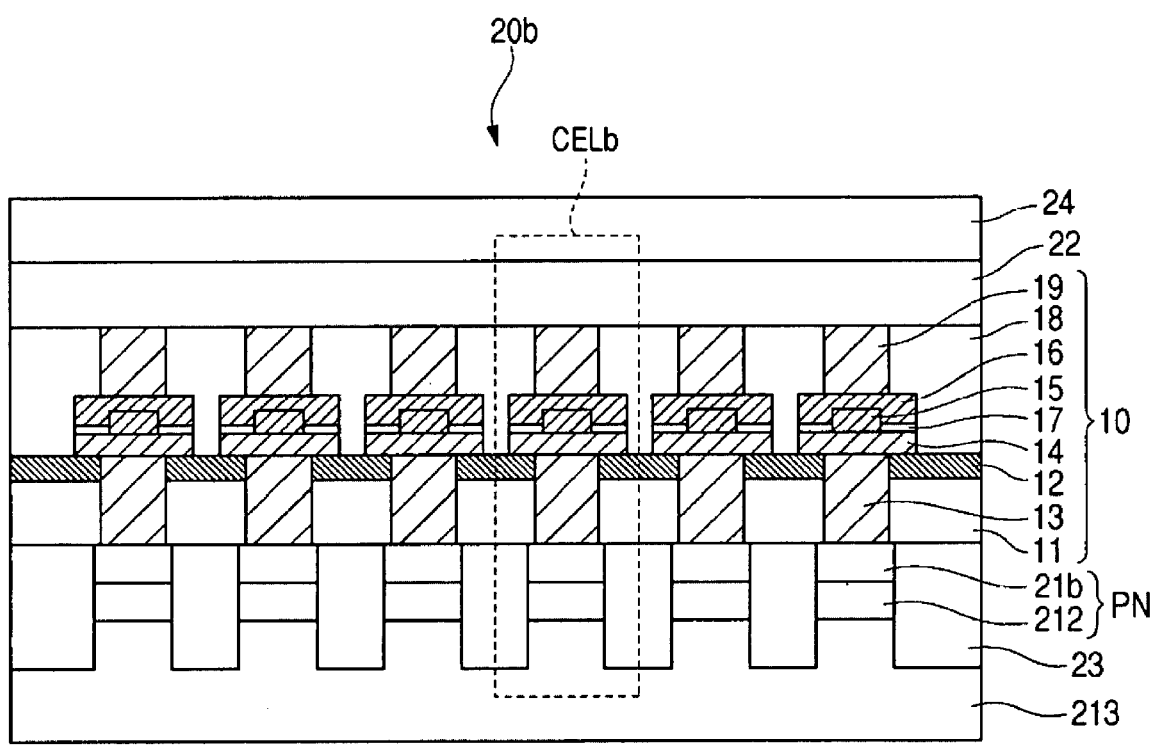
FIG. 15 is a sectional view of an example of a storage device according to a third embodiment.
Figure 16:
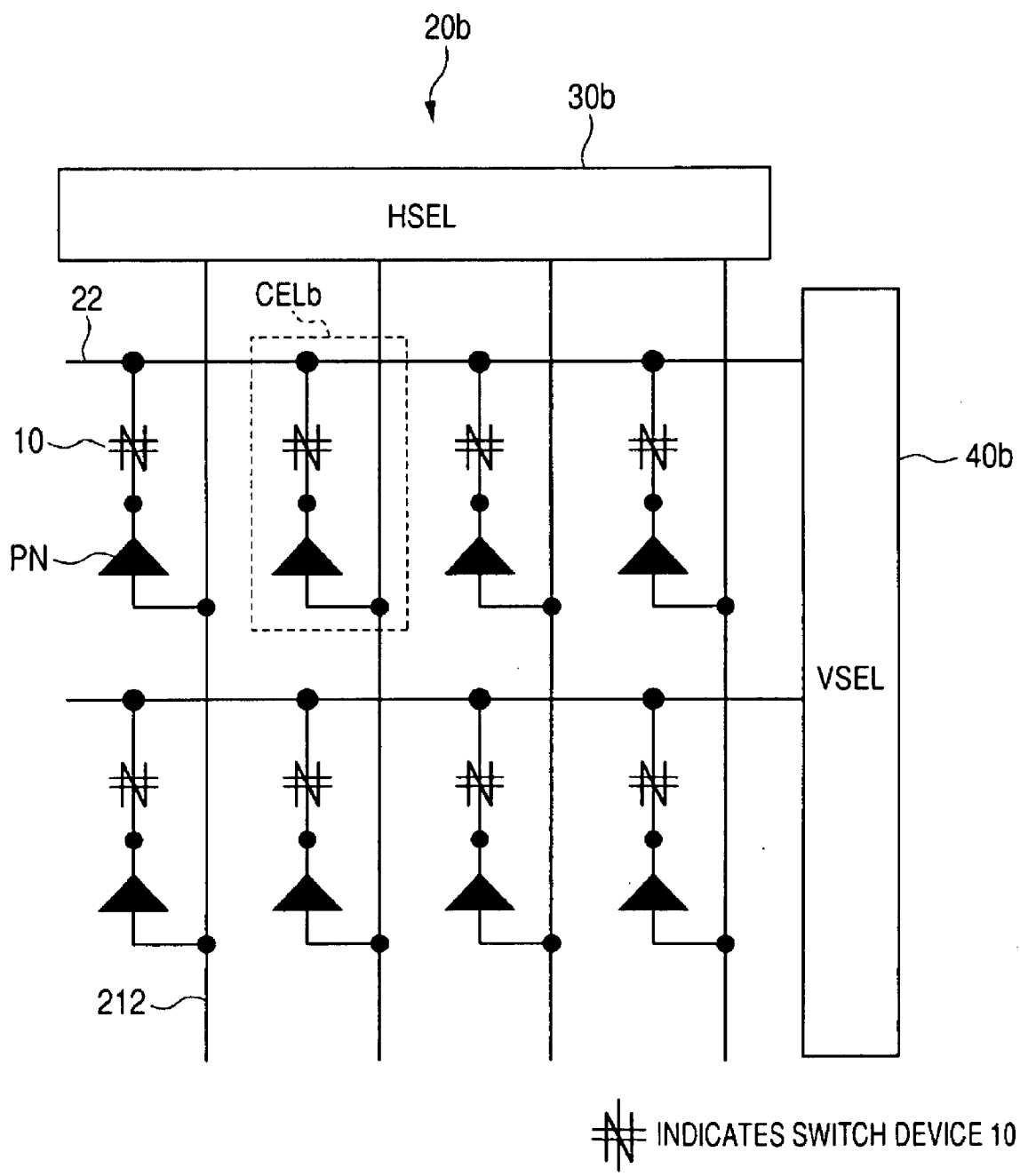
FIG. 16 is an equivalent circuit diagram of the storage device shown in FIG. 15.

FIG. 15 is a sectional view of an example of the storage device according to this embodiment. FIG. 16 is an equivalent circuit diagram of the storage device shown in FIG. 15. In FIG. 15, a part of the storage device such as an insulating film and a base layer is not shown.

As shown in FIG. 15, a storage device 20b includes electronic devices 10, n-type diffusion layers 21b, p-type diffusion layers 212, upper wiring layers 22 (first wiring layers), and insulating layers 23, 24, and 213. Diodes PN of PN junction are formed by the n-type diffusion layers 21b and the p-type diffusion layers 212 as column selection lines. Cells CELb are formed by the components.

As shown in FIG. 15, the storage device 20b includes a column selection circuit (HSEL) 30b as a first voltage supplying circuit, a row selection circuit (VSEL) 40b as a second voltage supplying circuit, and wiring layers (second wiring layers) 212.

In this embodiment, the first electrodes 14 are connected to the n-type diffusion layers 21b of the diodes. Components of the storage device different from those of the storage device according to the first embodiment are explained below.

As shown in FIG. 16, the cells CELb are arrayed in a matrix shape. In the figure, for simplification of explanation, it is assumed that eight cells CELb in total, two cells CELb in the row direction and four cells CELb in the column direction, are arrayed.

In the cells CELb in the same column (e.g., cells CELb(i, 1)), the p-type diffusion layers 212 in the cell CELb are connected in common to the wiring layers 213 (e.g., gate wiring layers (1)).

The n-type diffusion layers 21b are n-type silicon regions formed on the p-type diffusion layers 212 and are connected to the first electrodes 14 via the first contact holes 13. The n-type diffusion layers 21b other than surfaces in contact with the first contact holes 13 and the p-type diffusion layers 212 are insulated by the insulating layers 23 and 213.

The p-type diffusion layers 212 are p-type silicon regions formed on an insulating layers 214 and are connected to the n-type diffusion layers 21b. The p-type diffusion layers 212 other than surfaces in contact with the n-type diffusion layers 21b are insulated by the insulating layers 23 and 214. As shown in FIG. 16, the p-type diffusion layers 212 are connected to the column selection circuit 30b.

As shown in FIG. 16, the p-type diffusion layer 212 (anodes) of the diodes PN are connected to the column selection circuit 30b and the n-type diffusion layers 21b (cathodes) thereof are connected to the first electrodes 14 of the electronic devices 10. When bias is applied in a forward direction, electric currents flows from the p-type diffusion layers 212 to the electronic devices 10 through the n-type diffusion layers 21b.

In this embodiment, the storage device performs operations same as those performed by the storage device according to the first embodiment. For example, when attention is paid to a cell CELb(1, 1), the writing operation, the readout operation, and the erasing operation only have to be executed as explained below.

In the writing operation, the column selection circuit 30b applies the voltage of about 4 V to the p-type diffusion layers 212(1) and applies the voltage of about 0 V to the other p-type diffusion layers 212(1). The row selection circuit 40b applies the voltage of about 0 V to the upper wiring layers 22(1) and applies the voltage of 4 V to the other upper wiring layers 22.

At this point, in the selected cell CELb(1, 1), bias is applied to the electronic device 10 and ON writing is performed. In unselected cells CELb, voltage applied to the electronic devices 10 and the diodes PN is about 0 V or 4 V. However, even if the voltage is about 4 V, since the diodes PN have inverse bias and an electric current does not flow, writing is not performed.

In the readout operation, the column selection circuit 30b applies the voltage of about 2 V only to the p-type diffusion layers 212(1) and applies the voltage of about 0 V to the other p-type diffusion layers 212. The row selection circuit 40b applies the voltage of about 0 V to the upper wiring layers 22. Therefore, electric currents flowing to the cells CELb only have to be read out by the column selection lines (the p-type diffusion layers 212).

In the erasing operation, the column selection circuit 30b applies high voltage of about 6 V to the p-type diffusion layers 212(1) and applies the voltage of about 0 V to the other p-type diffusion layers 212. The row selection circuit 40b applies the voltage of about 0 V to the upper wiring layers 22 and applies the voltage of about 4 V to the unselected upper wiring layers 22. Thereafter, if the applied voltages are rapidly removed, it is possible to perform zero writing, i.e., erasing in the cell CELb(1, 1) to which voltage is applied.

As explained above, in this embodiment, since the diodes in which electric currents flow from the p-type diffusion layers 212 to the n-type diffusion layers 21b are used for selection of the cells CELb, it is possible to reduce a cell area from that in the storage device according to the second embodiment.

Advantages of the electronic device according to the embodiments are explained below.

The electronic device according to the embodiments is extremely simple in the structure and manufacturing and can execute a stable nonvolatile switch operation.

The two electrodes are stacked in substantially the same vertical line direction. Therefore, there is an advantage that an area occupied by the electronic device is extremely small compared with those of electronic devices having other structures.

A space between gaps can be adjusted by adjusting the thickness of the supporting film. Therefore, there is an advantage that the electronic device can be manufactured highly accurately and with high reproducibility and, in the manufacturing, a general manufacturing processing for a semiconductor integrated circuit can be used.

The electronic device is excellent in productivity because electrodes are processed in one process of photolithography and etching.

The thickness of the supporting film ($SiO_2$) supporting the two electrodes is set larger than the gap space. Therefore, an unnecessary leak current between the electrodes can be suppressed and long-term reliability of the supporting film is excellent.

The gap portion is covered with the insulating film. Therefore, there is an advantage that it is easy to protect the electronic device from contamination and short circuit.

The electronic device has high affinity with a semiconductor integrated circuit and can be easily integrally formed with a semiconductor circuit.

The SiN film or the alumina film with a high etching selection ratio with SiO$_2$ is used in the lower part of the electronic device. Therefore, there is an advantage that the etching process for the gap is prevented from adversely affecting the other portions.

Advantages of the storage device according to the embodiments are explained below.

The electronic devices are arranged between the upper and lower wiring layers. Therefore, it is easy to arrange the electronic devices in a matrix shape.

The independent high resistance state or low resistance state can be set for the electronic devices. Therefore, it is easy to utilize the storage device as a memory.

The cells in which the electronic devices and the transistors (MOSFETs) are connected in series are arranged in a matrix shape. Therefore, control of writing, readout, erasing, and the like of data can be freely performed according to potential (voltage) control for the respective wiring layers.

The cells in which the electronic devices and the diodes are connected in series are arranged in a matrix shape. Therefore, control of writing, readout, erasing, and the like of data can be freely performed according to potential (voltage) control for the respective wiring layers.

Various alterations of the present application are possible without departing from the spirit of the present application.

In the explanation of the embodiments, for simplification of explanation, an internal voltage fall related to the transistors and the diodes is not explained. When the present application is applied, it is necessary to, for example, set voltage taking into account a voltage fall, parasitic resistance, and the like of the transistors and the diodes.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electronic device comprising:
a first conductor;
an insulative supporting film formed in a part on one surface of the first conductor; and
a second conductor, one surface of which is opposed to the one surface of the first conductor and a part of which is supported by the supporting film, wherein
an air gap is formed in a region in which the first conductor and the second conductor are opposed to each other excluding the supporting film, and
thickness of the supporting film is larger than a space between the first conductor and the second conductor, at least a part of which forms the air gap.

2. An electronic device according to claim 1, wherein the supporting film includes:
an insulative substrate film that is stacked on the first conductor and supports the second conductor; and
an insulative adjusting film that is stacked on at least an upper layer surface of the substrate film and adjusts the space between the first conductor and the second conductor.

3. An electronic device according to claim 2, wherein
the supporting film is formed in the center of the first conductor and the second conductor, and
the air gap is formed in an outer periphery of the first conductor and the second conductor around the supporting film.

4. An electronic device according to claim 3, further comprising:
a first terminal connected to the first conductor; and
a second terminal connected to the second conductor, wherein
the first and second conductors and the supporting film are arranged to be on a same line.

5. An electronic device according to claim 4, wherein the first conductor and the second conductor have a same area.

6. An electronic device according to claim 1, wherein the supporting film is formed of silicon oxide.

7. An electronic device comprising:
a first conductor;
an insulative supporting film formed in a part on one surface of the first conductor; and
a second conductor, one surface of which is opposed to the one surface of the first conductor and a part of which is supported by the supporting film, wherein
an air gap is formed in a region in which the first conductor and the second conductor are opposed to each other excluding the supporting film,
thickness of the supporting film is thickness that can suppress an electric current flowing to the air gap, and
thickness of the air gap is smaller than the thickness of the supporting film.

8. An electronic device according to claim 7, wherein
the supporting film is formed in the center of the first conductor and the second conductor, and
the air gap is formed in an outer periphery of the first conductor and the second conductor around the supporting film.

9. An electronic device according to claim 8, further comprising:
a first terminal connected to the first conductor; and
a second terminal connected to the second conductor, wherein
the first and second conductors and the supporting film are arranged to be on a same line.

10. An electronic device according to claim 9, wherein the first conductor and the second conductor have a same area.

11. An electronic device according to claim 7, wherein the supporting film is formed of silicon oxide.

12. A storage device comprising:
an electronic device, a conduction state of which changes when a first conductor and a second conductor are subjected to voltage equal to or higher than threshold voltage;
plural cells that include first wiring layers connected to the first conductor and second wiring layers connected to the second conductor and are arrayed in a matrix shape;
a first voltage supplying circuit to which the first wiring layers are connected in common, the first voltage supplying circuit applying first voltage to the first wiring layer of the cell to which voltage is applied; and
a second voltage supplying circuit to which the second wiring layers are connected in common, the second voltage supplying circuit applying second voltage to the second wiring layer of the cell to which voltage is applied, wherein
the first and second voltage supplying circuits can supply the first and second voltages, respectively, such that a difference between voltages applied to the first conductor and the second conductor is selectively equal to or higher than the threshold voltage in the cell to which voltage is applied,
the electronic device includes:
the first conductor;

an insulative supporting film formed in a part on one surface of the first conductor; and the second conductor, one surface of which is opposed to the one surface of the first conductor and a part of which is supported by the supporting film, an air gap is formed in a region in which the first conductor and the second conductor are opposed to each other excluding the supporting film, and thickness of the supporting film is larger than a space between the first conductor and the second conductor, at least a part of which forms the air gap.

13. A storage device comprising:

an electronic device, a conduction state of which changes when a first conductor and a second conductor are subjected to voltage equal to or higher than threshold voltage;

plural cells that include first wiring layers connected to the second conductor, second wiring layers, transistors connected in series between the first conductor and the second wiring layers, and third wiring layers connected to gates of the transistors and are arrayed in a matrix shape;

a first voltage supplying circuit to which the third wiring layers are connected in common, the first voltage supplying circuit applying first voltage to the third wiring layer of the cell to which voltage is applied;

a second voltage supplying circuit to which the first wiring layers are connected in common, the second voltage supplying circuit applying second voltage to the first wiring layer of the cell to which voltage is applied; and a third voltage supplying circuit to which the second wiring layers are connected in common, the third voltage supplying circuit applying third voltage to the second wiring layer of the cell to which voltage is applied, wherein the first voltage supplying circuit can supply voltage for turning on the transistors, the second and third voltage supplying circuits can supply the second and third voltages, respectively, such that a difference between voltages applied to the first conductor and the second conductor is selectively equal to or higher than the threshold voltage in the cell to which voltage is applied, the electronic device includes:
the first conductor;
an insulative supporting film formed in a part on one surface of the first conductor; and
the second conductor, one surface of which is opposed to the one surface of the first conductor and a part of which is supported by the supporting film, an air gap is formed in a region in which the first conductor and the second conductor are opposed to each other excluding the supporting film, and the thickness of the supporting film is larger than a space between the first conductor and the second conductor, at least a part of which forms the air gap.

14. A storage device comprising:

an electronic device, a conduction state of which changes when a first conductor and a second conductor are subjected to voltage equal to or higher than threshold voltage;

plural cells that include first wiring layers connected to the second conductor, second wiring layers, and a diode connected in series between the first conductor and the second wiring layers and are arrayed in a matrix shape;

a first voltage supplying circuit to which the second wiring layers are connected in common, the first voltage supplying circuit applying first voltage to the second wiring layer of the cell to which voltage is applied; and a second voltage supplying circuit to which the first wiring layers are connected in common, the second voltage supplying circuit applying second voltage to the first wiring layer of the cell to which voltage is applied, wherein the first and second voltage supplying circuits can supply the first and second voltages, respectively, such that a difference between voltages applied to the first conductor and the second conductor is selectively equal to or higher than the threshold voltage in the cell to which voltage is applied, the electronic device includes:
the first conductor;
an insulative supporting film formed in a part on one surface of the first conductor; and
the second conductor, one surface of which is opposed to the one surface of the first conductor and a part of which is supported by the supporting film, wherein an air gap is formed in a region in which the first conductor and the second conductor are opposed to each other excluding the supporting film, and the thickness of the supporting film is larger than a space between the first conductor and the second conductor, at least a part of which forms the air gap.

* * * * *